(12) United States Patent
Nakajima et al.

(10) Patent No.: US 12,199,601 B2
(45) Date of Patent: Jan. 14, 2025

(54) SWITCH CIRCUIT AND RADIO-FREQUENCY CIRCUIT

(71) Applicant: Murata Manufacturing Co., Ltd., Kyoto (JP)

(72) Inventors: Reiji Nakajima, Kyoto (JP); Naoya Matsumoto, Kyoto (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 42 days.

(21) Appl. No.: 18/330,376

(22) Filed: Jun. 7, 2023

(65) Prior Publication Data

US 2024/0039528 A1 Feb. 1, 2024

(30) Foreign Application Priority Data

Jul. 26, 2022 (JP) ................. 2022-118583

(51) Int. Cl.
*H03K 17/687* (2006.01)
*H03H 11/04* (2006.01)

(52) U.S. Cl.
CPC ......... *H03K 17/6871* (2013.01); *H03H 11/04* (2013.01)

(58) Field of Classification Search
CPC ............. H03K 17/6871; H03K 17/693; H03K 17/002; H03K 17/687; H03H 11/04
See application file for complete search history.

(56) References Cited

U.S. PATENT DOCUMENTS

2018/0131369 A1* 5/2018 Popplewell ....... H01L 29/78603
2019/0288717 A1* 9/2019 Bai ........................ H01Q 1/243

FOREIGN PATENT DOCUMENTS

JP    2005-323304 A    11/2005

* cited by examiner

*Primary Examiner* — Metasebia T Retebo
(74) *Attorney, Agent, or Firm* — XSENSUS LLP

(57) ABSTRACT

A switch circuit includes: first through third common terminals; a first selection terminal that can be connected to the first through third common terminals; second and third selection terminals that can be connected to the first and third common terminals via a first node and can be connected to the first and second common terminals via a second node; first through third switches connected between the first through third common terminals and the first selection terminal; fourth through fifth switches connected between the first and third common terminals and the first node; sixth and seventh switches connected between the first and second common terminals and the second node; eighth and ninth switches connected between the second and third selection terminals and the first node; and tenth and eleventh switches connected between the second and third selection terminals and the second node.

20 Claims, 17 Drawing Sheets

SWITCH CIRCUIT AND RADIO-FREQUENCY CIRCUIT

CROSS-REFERENCE TO RELATED APPLICATION

The present application claims priority to Japanese Patent Application No. 2022-118583, filed on Jul. 26, 2022, the entire contents of which are incorporated herein by reference.

BACKGROUND

1. Field

The present disclosure relates to a switch circuit and a radio-frequency circuit.

2. Description of the Related Art

In communication devices that support multiple different bands and/or different multiple modes, multiple antennas are used to achieve simultaneous communication of multiple radio-frequency signals, and switch circuits are required to switch between the multiple antennas.

For example, Japanese Unexamined Patent Application Publication No. 2005-323304 discloses a multi-input multi-output switch that switches between signal paths by switching field-effect transistors (FETs) on and off.

However, in technology of the related art described above, it may be difficult to ensure isolation between signal paths during simultaneous communication of multiple radio-frequency signals.

SUMMARY OF THE DISCLOSURE

Accordingly, the present disclosure provides a multi-input multi-output switch circuit that can improve isolation and a radio-frequency circuit including the multi-input multi-output switch circuit.

A switch circuit according to an aspect of the present disclosure includes: a first common terminal, a second common terminal, and a third common terminal; a first selection terminal that is connectible to the first common terminal, the second common terminal, and the third common terminal; a second selection terminal and a third selection terminal that are connectible to the first common terminal and the third common terminal via a first node and are connectible to the first common terminal and the second common terminal via a second node; a first switch connected between the first common terminal and the first selection terminal; a second switch connected between the second common terminal and the first selection terminal; a third switch connected between the third common terminal and the first selection terminal; a fourth switch connected between the first common terminal and the first node; a fifth switch connected between the third common terminal and the first node; a sixth switch connected between the first common terminal and the second node; a seventh switch connected between the second common terminal and the second node; an eighth switch connected between the second selection terminal and the first node; a ninth switch connected between the third selection terminal and the first node; a tenth switch connected between the second selection terminal and the second node; and an eleventh switch connected between the third selection terminal and the second node.

A radio-frequency circuit according to an aspect of the present disclosure includes: the above-described switch circuit; a first low-pass filter connected to the first common terminal; a second low-pass filter connected to the second common terminal; and a third low-pass filter connected to the third common terminal.

A radio-frequency circuit according to an aspect of the present disclosure includes a switch circuit and a first low-pass filter and a second low-pass filter. The switch circuit includes a first common terminal, a second common terminal, and a third common terminal, a first selection terminal, a second selection terminal, and a third selection terminal, a first connection terminal connected to the first common terminal and the third common terminal via a first node, a second connection terminal connected to the first common terminal and the second common terminal via a second node, a third connection terminal connected to the second selection terminal and the third selection terminal via a third node, a fourth connection terminal connected to the second selection terminal and the third selection terminal via a fourth node, a first switch connected between the first common terminal and the first selection terminal, a second switch connected between the second common terminal and the first selection terminal, a third switch connected between the third common terminal and the first selection terminal, a fourth switch connected between the first common terminal and the first node, a fifth switch connected between the third common terminal and the first node, a sixth switch connected between the first common terminal and the second node, a seventh switch connected between the second common terminal and the second node, an eighth switch connected between the second selection terminal and the third node, a ninth switch connected between the third selection terminal and the third node, a tenth switch connected between the second selection terminal and the fourth node, and an eleventh switch connected between the third selection terminal and the fourth node. The first low-pass filter is connected between the first connection terminal and the third connection terminal. The second low-pass filter is connected between the second connection terminal and the fourth connection terminal.

The switch circuit according to an aspect of the present disclosure can improve isolation in multi-input multi-output switch circuits.

DESCRIPTION

Background

In multi-input multi-output switch circuits, it may be difficult to ensure isolation between paths due to crossings or overpass crossing between paths within the switch circuit. For example, in a triple-pole triple-throw (3P3T) type switch circuit, at least one crossing or overpass crossing occurs between the nine paths connecting the three common terminals and the three selection terminals to each other.

Figure 1:
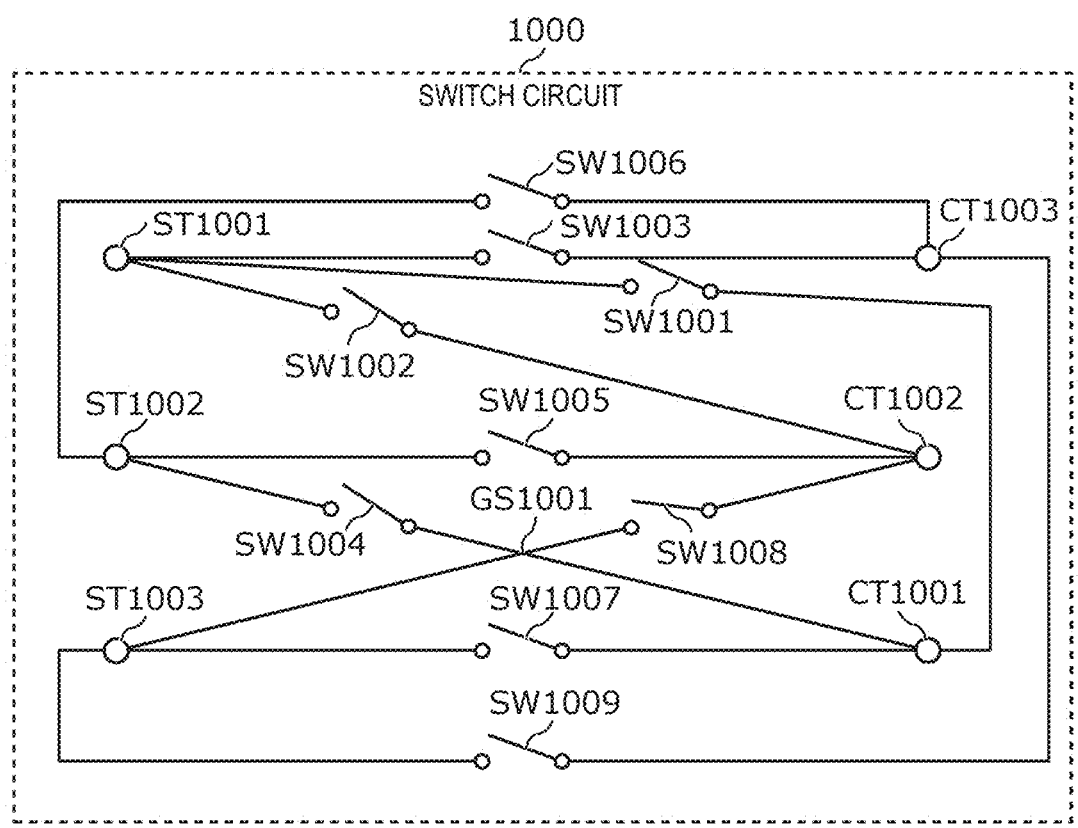
FIG. 1 is a circuit configuration diagram of a 3P3T-type switch circuit according to a comparative example.

FIG. 1 is a circuit configuration diagram of a 3P3T-type switch circuit according to a comparative example. A switch circuit 1000 according to the comparative example includes common terminals CT1001 to CT1003, selection terminals ST1001 to ST1003, and single-pole single-throw (SPST) switches SW1001 to SW1009 disposed serially along individual paths. At least one crossing or overpass crossing occurs between the paths within the switch circuit 1000. In FIG. 1, an overpass crossing GS1001 occurs between the path connecting the common terminal CT1001 and the selection terminal ST1002 to each other and the path connecting the common terminal CT1002 and the selection terminal ST1003 to each other. In this case, it is difficult to ensure isolation between the two paths, and signal interference increases based on both of the switches SW1004 and SW1008 being closed (i.e., turned on).

Accordingly, hereafter, a multi-input multi-output switch circuit that can improve isolation will be described in detail on the basis of embodiments. The embodiments described hereafter each illustrate a comprehensive or specific example of the present disclosure. The numerical values, shapes, materials, constituent elements, arrangements of the constituent elements, the ways in which the constituent elements are connected, and so forth described in the following embodiments are merely examples and are not intended to limit the present disclosure.

The drawings are schematic diagrams in which certain elements are emphasized or omitted or their proportions are adjusted as appropriate in order to illustrate the present disclosure, the drawings are not necessarily illustrated in a strictly accurate manner, and the actual shapes, positional relationships, and proportions may be different. In the drawings, configurations that are substantially the same as each other may be denoted by the same symbols and repeated description thereof may be omitted or simplified.

In the drawings referred to below, an x axis and a y axis are mutually perpendicular axes on a plane that is parallel to main surfaces of a module substrate. Specifically, based on the module substrate having a rectangular shape in plan view, the x-axis is parallel to a first side of the module substrate and the y-axis is parallel to a second side of the module substrate, which is perpendicular to the first side. In addition, a z axis is an axis that is perpendicular to the main surfaces of the module substrate, and a positive z axis direction indicates an upward direction and a negative z axis direction indicates a downward direction.

In circuit configurations of the present disclosure, the meaning of "connected" includes not only direct connections with connection terminals and/or wiring conductors, but also electrical connections realized via other circuit elements. "Connected between A and B" means connected to both A and B between A and B or means serially connected to a path connecting A and B to each other.

In circuit configurations of the present disclosure, "terminal" means a point where a conductor inside an element ends. If the impedance of a conductor serving as a path between elements is sufficiently low, a terminal is interpreted as being any point on the path between the elements or the entire path, rather than just a single point. The term "node" means any point along a path between elements or the entire path.

In the present disclosure, "transmission band" means a frequency band used in transmission in a communication device. "Reception band" means a frequency band used in reception in a communication device. For example, in frequency division duplex (FDD) bands, different frequency bands are used for the transmission band and the reception band, whereas in time division duplex (TDD) bands, the same frequency band is used for the transmission band and the reception band. In particular, based on a communication device functioning as user equipment (UE) in a cellular communication system, an uplink operation band can be used as a transmission band and a downlink operation band can be used as the reception band in the FDD bands. Conversely, based on a communication device functioning as a base station (BS) in a cellular communication system, a downlink operation band can be used as a transmission band and an uplink operation band can be used as a reception band in the FDD bands.

With respect to arrangement of components in the present disclosure, "a plan view" refers to objects being viewed from the positive z-axis side as orthographic projections onto the xy-plane. "A is disposed between B and C" means that at least one of a plurality of line segments connecting any point inside B and any point inside C passes through A. "A is disposed closer to a plurality of C than B is" means that the shortest distance between A and the plurality of C is shorter than the shortest distance between B and the plurality of C. The shortest distance between A and a plurality of C means the shortest distance out of the distances between A and the plurality of C. Terms indicating relationships between elements, such as "parallel" and "perpendicular," and terms indicating the shape of elements, such as "rectangle," as well as numerical ranges, are not meant to express only a strict meaning, but also to include substantially equivalent ranges, for example, errors of several percent.

Embodiment 1

Hereafter, a communication device 5 according to Embodiment 1 will be described. The communication device 5 according to this embodiment corresponds to a user terminal in a cellular communication system and is typically a mobile phone, a smart phone, a tablet computer, a wearable device, or the like. The communication device 5 may be an Internet of Things (IoT) sensor device, a medical/healthcare device, a car, an unmanned aerial vehicle (UAV) (a so-called drone), or an automated guided vehicle (AGV). The communication device 5 may also be used as a base station in a cellular communication system.

Figure 2:
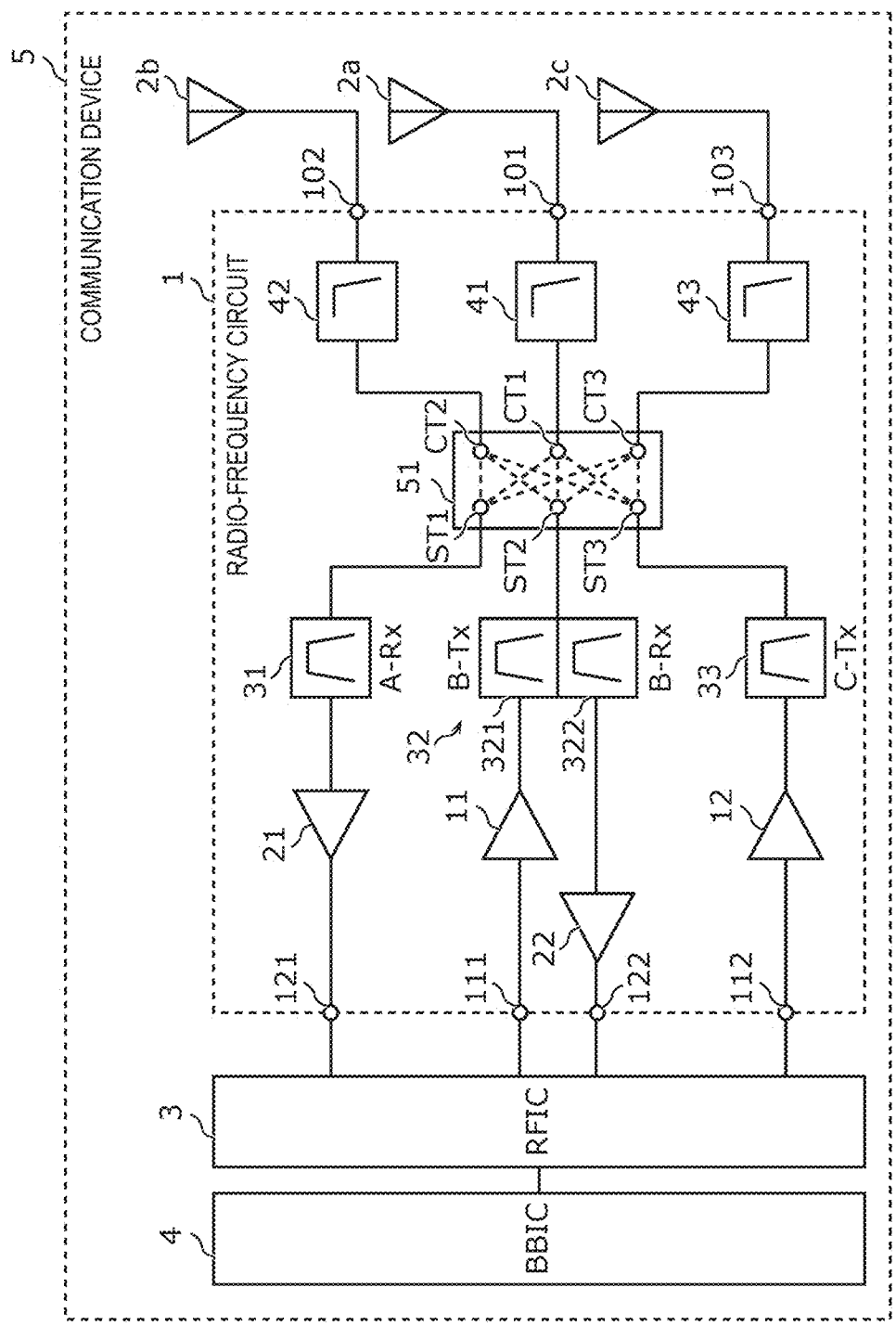
FIG. 2 is a circuit configuration diagram of a communication device according to Embodiment 1.
Figure 3:
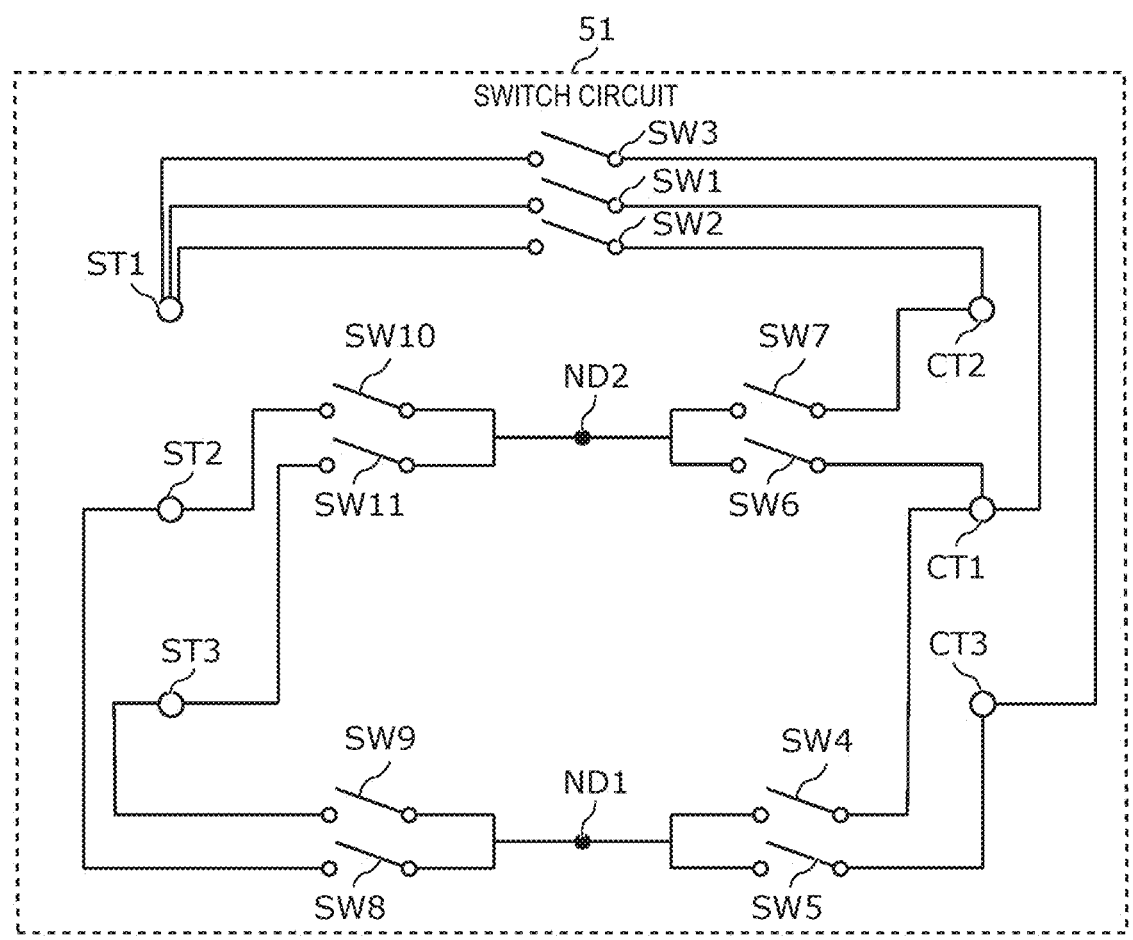
FIG. 3 is a circuit configuration diagram of a switch circuit according to Embodiment 1.

The circuit configurations of the communication device 5, a radio-frequency circuit 1, and a switch circuit 51 according to this embodiment will be described while referring to FIGS. 2 and 3. FIG. 2 is a circuit configuration diagram of the communication device 5 according to this embodiment. FIG. 3 is a circuit configuration diagram of the switch circuit 51 according to this embodiment.

FIGS. 2 and 3 illustrate example circuit configurations, and the communication device 5, the radio-frequency circuit 1, and the switch circuit 51 can be realized using any of a wide variety of circuit configurations and circuit technologies. Therefore, the description of the communication device 5, the radio-frequency circuit 1, and the switch circuit 51 provided hereafter should not be interpreted as being limiting.

1.1 Circuit Configuration of Communication Device 5

First, the circuit configuration of the communication device 5 according to this embodiment will be described while referring to FIG. 2. The communication device 5 includes the radio-frequency circuit 1, antennas 2a to 2c, a radio frequency integrated circuit (RFIC) 3, and a baseband integrated circuit (BBIC) 4.

The radio-frequency circuit 1 transmits radio-frequency signals between the antennas 2a to 2c and the RFIC 3. The internal configuration of the radio-frequency circuit 1 will be described later.

The antennas 2a to 2c are respectively connected to antenna connection terminals 101 to 103 of the radio-frequency circuit 1. Each of the antennas 2a to 2c receives radio-frequency signals from outside the communication device 5 and transmits the received radio-frequency signals to the radio-frequency circuit 1. Each of the antennas 2a to 2c receives radio-frequency signals from the radio-frequency circuit 1 and outputs the received radio-frequency signals to outside the communication device 5. Note that the antennas 2a to 2c do not have to be included in the communication device 5. In addition to the antennas 2a to 2c, the communication device 5 may further include one or more additional antennas.

The RFIC 3 is an example of a signal processing circuit that processes radio-frequency signals. Specifically, the RFIC 3 subjects a radio-frequency reception signal input thereto via a reception path of the radio-frequency circuit 1 to signal processing using down conversion and so forth and outputs a reception signal generated through this signal processing to the BBIC 4. In addition, the RFIC 3 subjects a transmission signal input thereto from the BBIC 4 to signal processing using up conversion and so forth and outputs a radio-frequency transmission signal generated through this signal processing to the radio-frequency circuit 1. In addition, the RFIC 3 may include a control unit that controls switches, amplifiers, and other components included in the radio-frequency circuit 1. Some or all of the functions of the control unit of the RFIC 3 may be implemented outside the RFIC 3, for example, may be included in the BBIC 4 or the radio-frequency circuit 1.

The BBIC 4 is a base band signal processing circuit that performs signal processing using an intermediate frequency band located at a lower frequency than radio-frequency signals transmitted by the radio-frequency circuit 1. A signal processed by the BBIC 4 is used as an image signal for image display and/or as an audio signal for a telephone call via a speaker, for example. Note that the BBIC 4 does not have to be included in the communication device 5.

1.2 Circuit Configuration of Radio-Frequency Circuit 1

Next, the radio-frequency circuit 1 according to this embodiment will be described while referring to FIG. 2. The radio-frequency circuit 1 includes power amplifiers 11 and 12, low-noise amplifiers 21 and 22, filters 31 to 33, low-pass filters 41 to 43, the switch circuit 51, the antenna connection terminals 101 to 103, input terminals 111 and 112, and output terminals 121 and 122.

The antenna connection terminals 101 to 103 are external terminals of the radio-frequency circuit 1 and are used to receive reception signals from outside the radio-frequency circuit 1 and/or supply transmission signals to outside the radio-frequency circuit 1. The antenna connection terminals 101 to 103 are respectively connected to the antennas 2a to 2c, which are outside the radio-frequency circuit 1, and are respectively connected to the low-pass filters 41 to 43, which are inside the radio-frequency circuit 1.

The input terminals 111 and 112 are external connection terminals of the radio-frequency circuit 1 and are for receiving transmission signals from outside the radio-frequency circuit 1. The input terminal 111 is connected to the RFIC 3 outside the radio-frequency circuit 1 and is connected to the input terminal of the power amplifier 11 inside the radio-frequency circuit 1. The input terminal 112 is connected to the RFIC 3 outside the radio-frequency circuit 1 and is connected to the input terminal of the power amplifier 12 inside the radio-frequency circuit 1.

The output terminals 121 and 122 are external connection terminals of the radio-frequency circuit 1 and are for supplying reception signals to outside the radio-frequency circuit 1. The output terminal 121 is connected to the RFIC 3 outside the radio-frequency circuit 1 and to the output terminal of the low-noise amplifier 21 inside the radio-frequency circuit 1. The output terminal 122 is connected to the RFIC 3 outside the radio-frequency circuit 1 and to the output terminal of the low-noise amplifier 22 inside the radio-frequency circuit 1.

The power amplifier 11 is connected between the input terminal 111 and the filter 32. Specifically, the input terminal of the power amplifier 11 is connected to the input terminal 111, and the output terminal of the power amplifier 11 is connected to a transmission filter 321 included in the filter 32. In this connection configuration, the power amplifier 11 can amplify a radio-frequency signal supplied from the RFIC 3 via the input terminal 111.

The power amplifier 12 is connected between the input terminal 112 and the filter 33. Specifically, the input terminal of the power amplifier 12 is connected to the input terminal 112, and the output terminal of the power amplifier 12 is connected to the filter 33. In this connection configuration, the power amplifier 12 can amplify a radio-frequency signal supplied from the RFIC 3 via the input terminal 112.

The low-noise amplifier 21 is connected between the filter 31 and the output terminal 121. Specifically, the input terminal of the low-noise amplifier 21 is connected to the filter 31, and the output terminal of the low-noise amplifier 21 is connected to the output terminal 121. In this connection configuration, the low-noise amplifier 21 can amplify a radio-frequency signal that has passed through the filter 31.

The low-noise amplifier 22 is connected between the filter 32 and the output terminal 122. Specifically, the input terminal of the low-noise amplifier 22 is connected to a reception filter 322 included in the filter 32, and the output terminal of the low-noise amplifier 22 is connected to the output terminal 122. In this connection configuration, the low-noise amplifier 22 can amplify a radio-frequency signal that has passed through the reception filter 322.

The filter 31 (A-Rx) is an example of a fourth filter and is connected between the switch circuit 51 and the input terminal of the low-noise amplifier 21. The filter 31 is a band-pass filter having a passband that includes a reception band of Band A.

The filter 32 is an example of a fifth filter and is connected between the switch circuit 51, the power amplifier 11, and the low-noise amplifier 22. The filter 32 is a duplexer that includes the transmission filter 321 and the reception filter 322.

The transmission filter 321 (B-Tx) is connected between the switch circuit 51 and the output terminal of the power amplifier 11. The transmission filter 321 has a passband that includes a transmission band of Band B.

The reception filter 322 (B-Rx) is connected between the switch circuit 51 and the input terminal of the low-noise amplifier 22. The reception filter 322 has a passband that includes a reception band of Band B.

The filter 33 (C-Tx) is an example of a sixth filter and is connected between the switch circuit 51 and the output terminal of the power amplifier 12. The filter 33 has a passband that includes a transmission band of Band C.

Bands A to C are different frequency bands for communication systems constructed using radio access technology (RAT) and are combinations of bands that can be used simultaneously. Bands A to C are predefined by standards organizations (for example, the third Generation Partnership Project (3GPP) (registered trademark) and the Institute of Electrical and Electronics Engineers (IEEE)). Examples of such communication systems may include fifth Generation New Radio (5G NR) systems, Long Term Evolution (LTE) systems, and Wireless Local Area Network (WLAN) systems.

The low-pass filter 41 is an example of a first low-pass filter and is connected between the antenna connection terminal 101 and the switch circuit 51. The low-pass filter 41 has a higher cutoff frequency than Bands A to C.

The low-pass filter 42 is an example of a second low-pass filter and is connected between the antenna connection terminal 102 and the switch circuit 51. The low-pass filter 42 has a higher cutoff frequency than Bands A to C.

The low-pass filter 43 is an example of a third low-pass filter and is connected between the antenna connection terminal 103 and the switch circuit 51. The low-pass filter 43 has a higher cutoff frequency than Bands A to C.

The switch circuit 51 is connected between the low-pass filters 41 to 43 and the filters 31 to 33. The switch circuit 51 includes common terminals CT1 to CT3 and selection terminals ST1 to ST3. The common terminal CT1 is an example of a first common terminal and is connected to the low-pass filter 41. The common terminal CT2 is an example of a second common terminal and is connected to the low-pass filter 42. The common terminal CT3 is an example of a third common terminal and is connected to the low-pass filter 43. The selection terminal ST1 is an example of a first selection terminal and is connected to the filter 31. The selection terminal ST2 is an example of a second selection terminal and is connected to the filter 32. The selection terminal ST3 is an example of a third selection terminal and is connected to the filter 33.

1.3 Circuit Configuration of Switch Circuit 51

Next, the circuit configuration of the switch circuit 51 according to this embodiment will be described while referring to FIG. 3. The switch circuit 51 includes SPST-type switches SW1 to SW11 in addition to the common terminals CT1 to CT3 and the selection terminals ST1 to ST3.

The switch SW1 is an example of a first switch and is connected between the common terminal CT1 and the selection terminal ST1. Based on the switch SW1 being closed (i.e., turned on), the common terminal CT1 is connected to the selection terminal ST1. Conversely, based on the switch SW1 being open (i.e., turned off), the common terminal CT1 is not connected to the selection terminal ST1.

The switch SW2 is an example of a second switch and is connected between the common terminal CT2 and the selection terminal ST1. Based on the switch SW2 being closed, the common terminal CT2 is connected to the selection terminal ST1. Conversely, based on the switch SW2 being open, the common terminal CT2 is not connected to the selection terminal ST1.

The switch SW3 is an example of a third switch and is connected between the common terminal CT3 and the selection terminal ST1. Based on the switch SW3 being closed, the common terminal CT3 is connected to the selection terminal ST1. Conversely, based on the switch SW3 being open, the common terminal CT3 is not connected to the selection terminal ST1.

The switch SW4 is an example of a fourth switch and is connected between the common terminal CT1 and a node ND1. Based on the switch SW4 being closed, the common terminal CT1 is connected to the node ND1. Conversely, based on the switch SW4 being open, the common terminal CT1 is not connected to the node ND1.

The switch SW5 is an example of a fifth switch and is connected between the common terminal CT3 and the node ND1. Based on the switch SW5 being closed, the common terminal CT3 is connected to the node ND1. Conversely, based on the switch SW5 being open, the common terminal CT3 is not connected to the node ND1.

The switch SW6 is an example of a sixth switch and is connected between the common terminal CT1 and a node ND2. Based on the switch SW6 being closed, the common terminal CT1 is connected to the node ND2. Conversely, based on the switch SW6 being open, the common terminal CT1 is not connected to the node ND2.

The switch SW7 is an example of a seventh switch and is connected between the common terminal CT2 and the node ND2. Based on the switch SW7 being closed, the common terminal CT2 is connected to the node ND2. Conversely, based on the switch SW7 being open, the common terminal CT2 is not connected to the node ND2.

The switch SW8 is an example of an eighth switch and is connected between the selection terminal ST2 and the node ND1. Based on the switch SW8 being closed, the selection terminal ST2 is connected to the node ND1. Conversely, based on the switch SW8 being open, the selection terminal ST2 is not connected to the node ND1.

The switch SW9 is an example of a ninth switch and is connected between the selection terminal ST3 and the node ND1. Based on the switch SW9 being closed, the selection terminal ST3 is connected to the node ND1. Conversely, based on the switch SW9 being open, the selection terminal ST3 is not connected to the node ND1.

The switch SW10 is an example of an tenth switch and is connected between the selection terminal ST2 and the node ND2. Based on the switch SW10 being closed, the selection terminal ST2 is connected to the node ND2. Conversely, based on the switch SW10 being open, the selection terminal ST2 is not connected to the node ND2.

The switch SW11 is an example of an eleventh switch and is connected between the selection terminal ST3 and the node ND2. Based on the switch SW11 being closed, the selection terminal ST3 is connected to the node ND2. Conversely, based on the switch SW11 being open, the selection terminal ST3 is not connected to the node ND2.

The node ND1 is an example of a first node and connects the switches SW4, SW5, SW8, and SW9 to each other. The common terminals CT1 and CT3 are connected to the selection terminals ST2 and ST3 via the node ND1.

The node ND2 is an example of a second node and connects the switches SW6, SW7, SW10, and SW11 to each other. The common terminals CT1 and CT2 are connected to the selection terminals ST2 and ST3 via the node ND2.

Note that the switch circuit 51 is not limited to the circuit configuration in FIG. 3. For example, the switch circuit 51 may include a shunt switch that connects a signal path to ground. In this case, the shunt switch may be closed based on the signal path being in a non-conductive state. This enables isolation between paths to be improved.

1.4 Connection States of Switch Circuit 51

Next, the connections between the common terminals CT1 to CT3 and the selection terminals ST1 to ST3 inside the switch circuit 51 will be described while referring to FIGS. 4 to 9. FIGS. 4 to 9 are diagrams illustrating the connection states inside the switch circuit 51 according to this embodiment.

In the upper left part of each of FIGS. 4 to 9, a connection state diagram of the connections between the common terminals CT1 to CT3 and the selection terminals ST1 to ST3 is illustrated, and below the connection state diagram, a circuit configuration diagram of the switch circuit 51 is illustrated. In the circuit configuration diagram, a path illustrated by a solid line represents a conductive state, and a path illustrated by a dashed line represents a non-conductive state.

Figure 4:
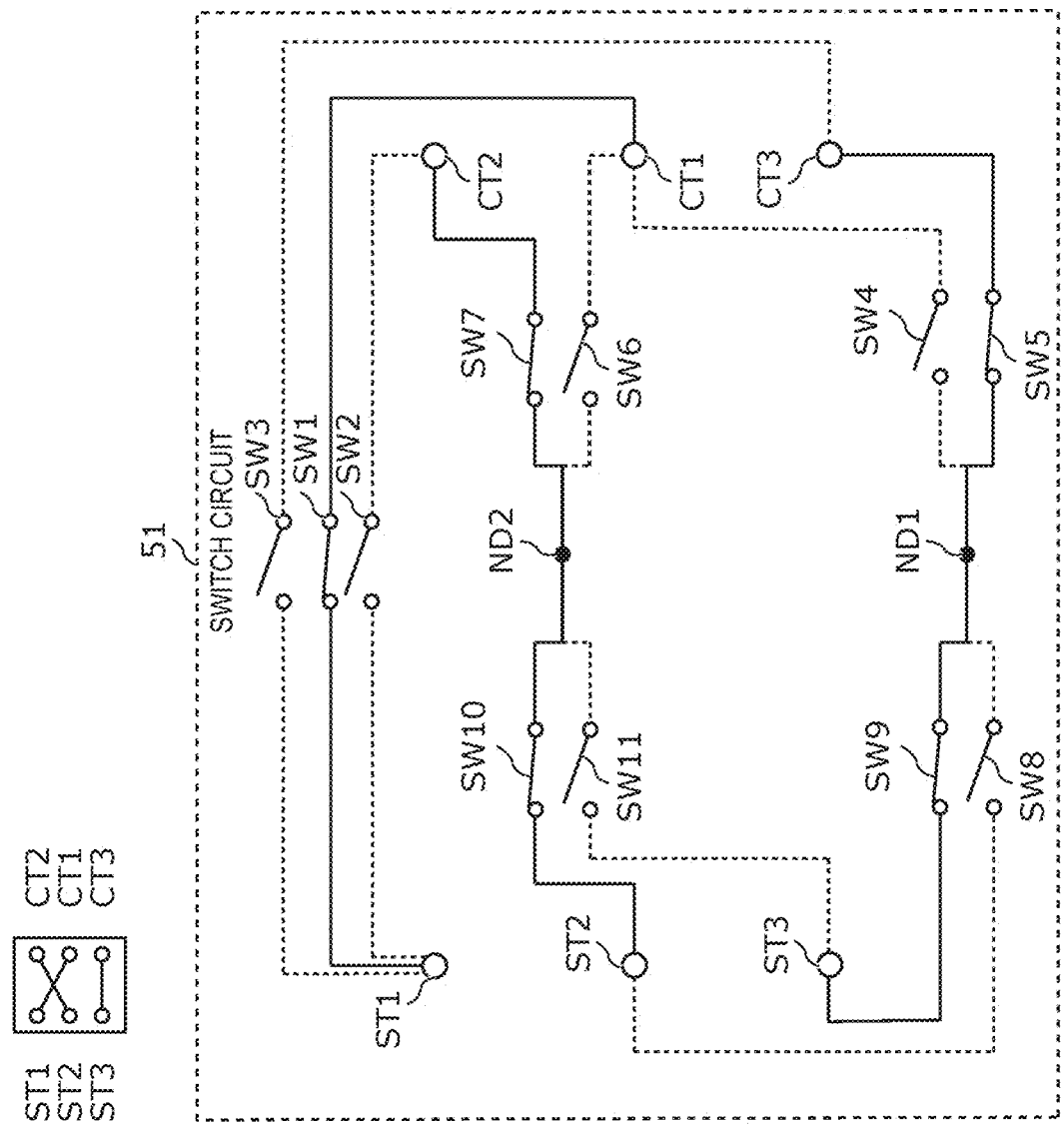
FIG. 4 is a diagram illustrating connection states inside the switch circuit according to Embodiment 1.

In FIG. 4, the switches SW1, SW5, SW7, SW9, and SW10 are closed and the other switches are open. Thus, the common terminal CT1 is connected to the selection terminal ST1 via the switch SW1. The common terminal CT2 is connected to the selection terminal ST2 via the switch SW7, the node ND2, and the switch SW10. The common terminal CT3 is connected to the selection terminal ST3 via the switch SW5, the node ND1, and the switch SW9.

Figure 5:
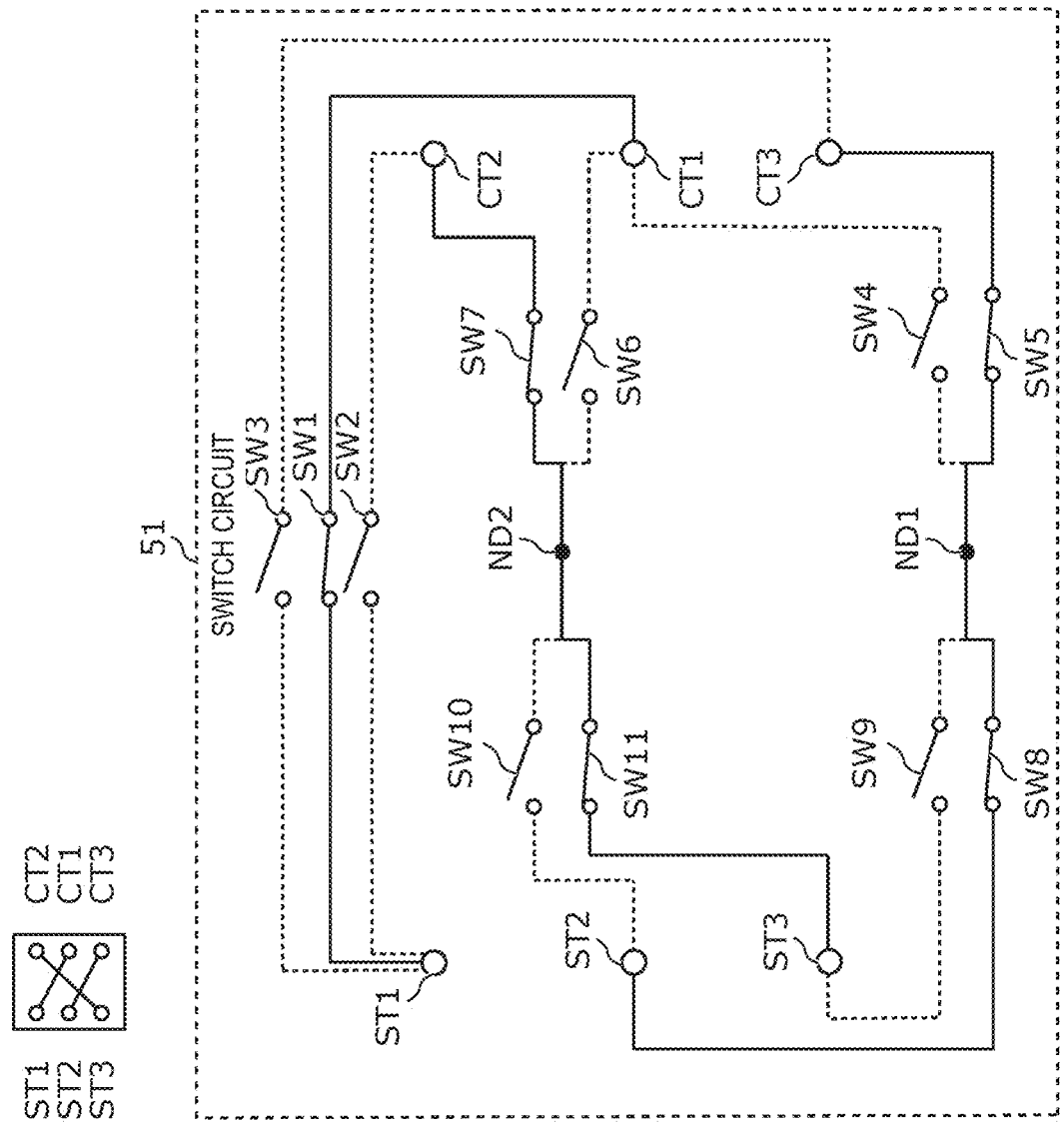
FIG. 5 is a diagram illustrating connection states inside the switch circuit according to Embodiment 1.

In FIG. 5, the switches SW1, SW5, SW7, SW8, and SW11 are closed and the other switches are open. Thus, the common terminal CT1 is connected to the selection terminal ST1 via the switch SW1. The common terminal CT2 is connected to the selection terminal ST3 via the switch SW7, the node ND2, and the switch SW11. The common terminal CT3 is connected to the selection terminal ST2 via the switch SW5, the node ND1, and the switch SW8.

Figure 6:
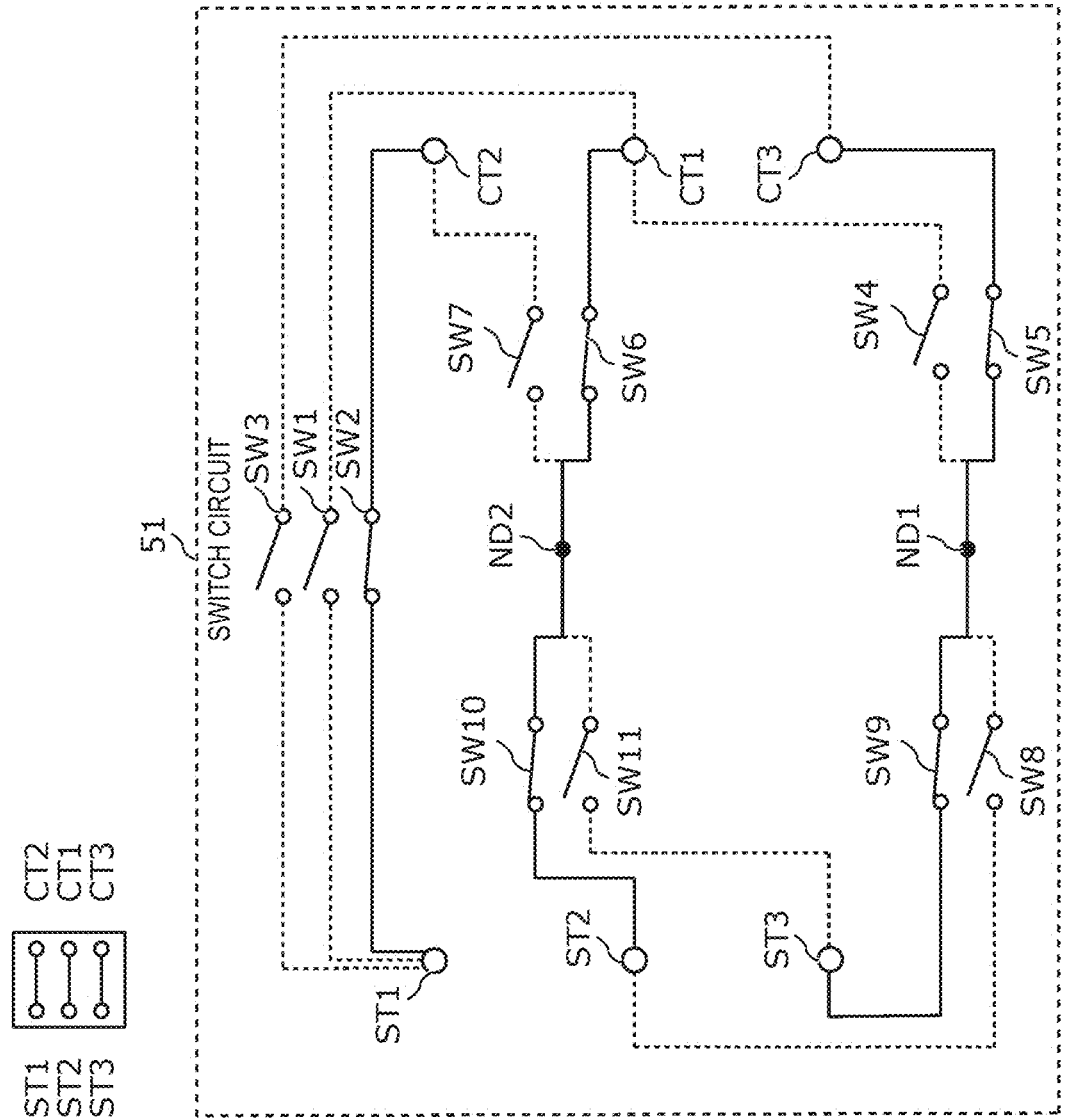
FIG. 6 is a diagram illustrating connection states inside the switch circuit according to Embodiment 1.

In FIG. 6, the switches SW2, SW5, SW6, SW9, and SW10 are closed and the other switches are open. Thus, the common terminal CT1 is connected to the selection terminal ST2 via the switch SW6, the node ND2, and the switch SW10. The common terminal CT2 is connected to the selection terminal ST1 via the switch SW2. The common terminal CT3 is connected to the selection terminal ST3 via the switch SW5, the node ND1, and the switch SW9.

Figure 7:
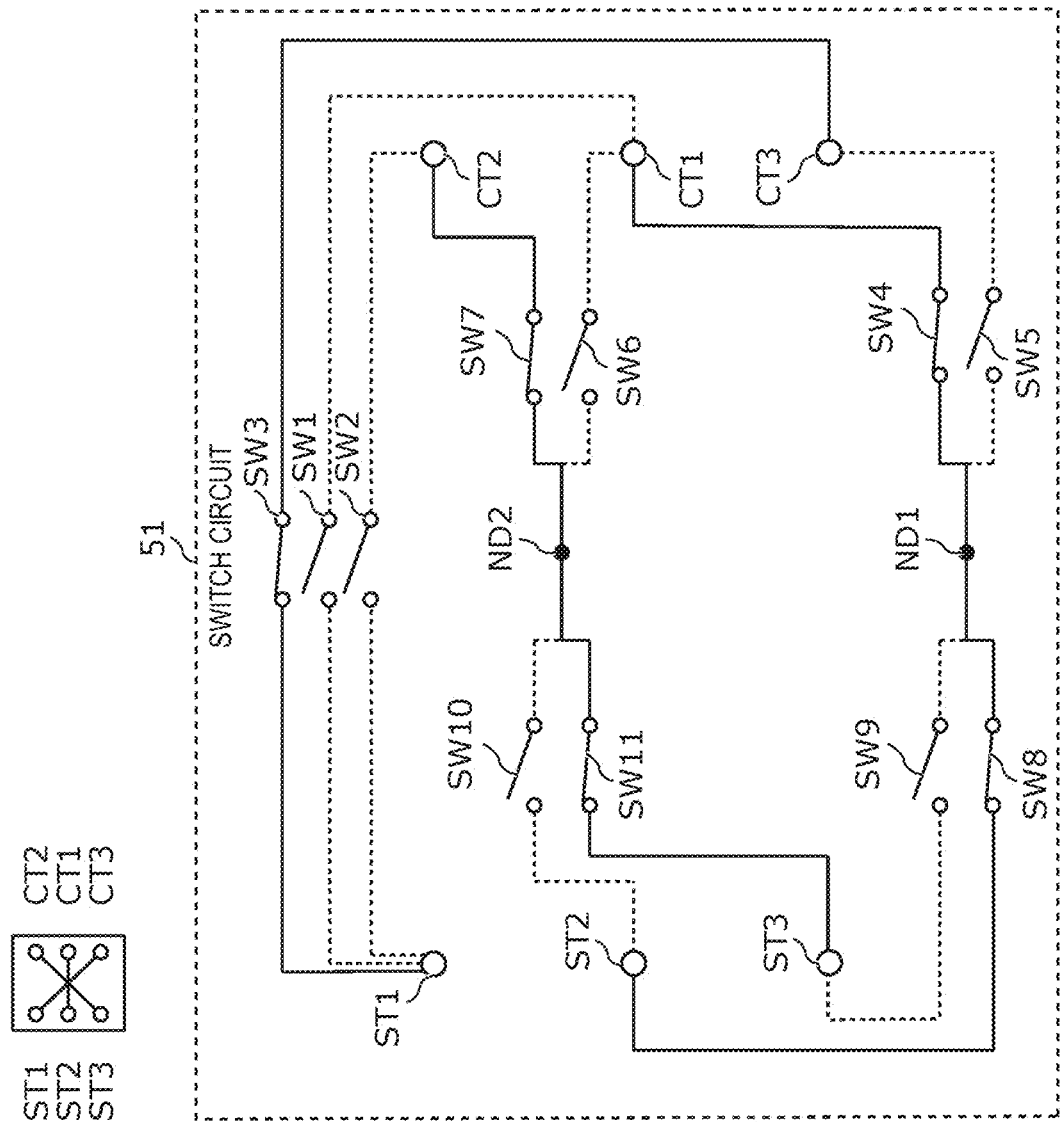
FIG. 7 is a diagram illustrating connection states inside the switch circuit according to Embodiment 1.

In FIG. 7, the switches SW3, SW4, SW7, SW8, and SW11 are closed and the other switches are open. Thus, the common terminal CT1 is connected to the selection terminal ST2 via the switch SW4, the node ND1, and the switch SW8. The common terminal CT2 is connected to the selection terminal ST3 via the switch SW7, the node ND2, and the switch SW11. The common terminal CT3 is connected to the selection terminal ST1 via the switch SW3.

Figure 8:
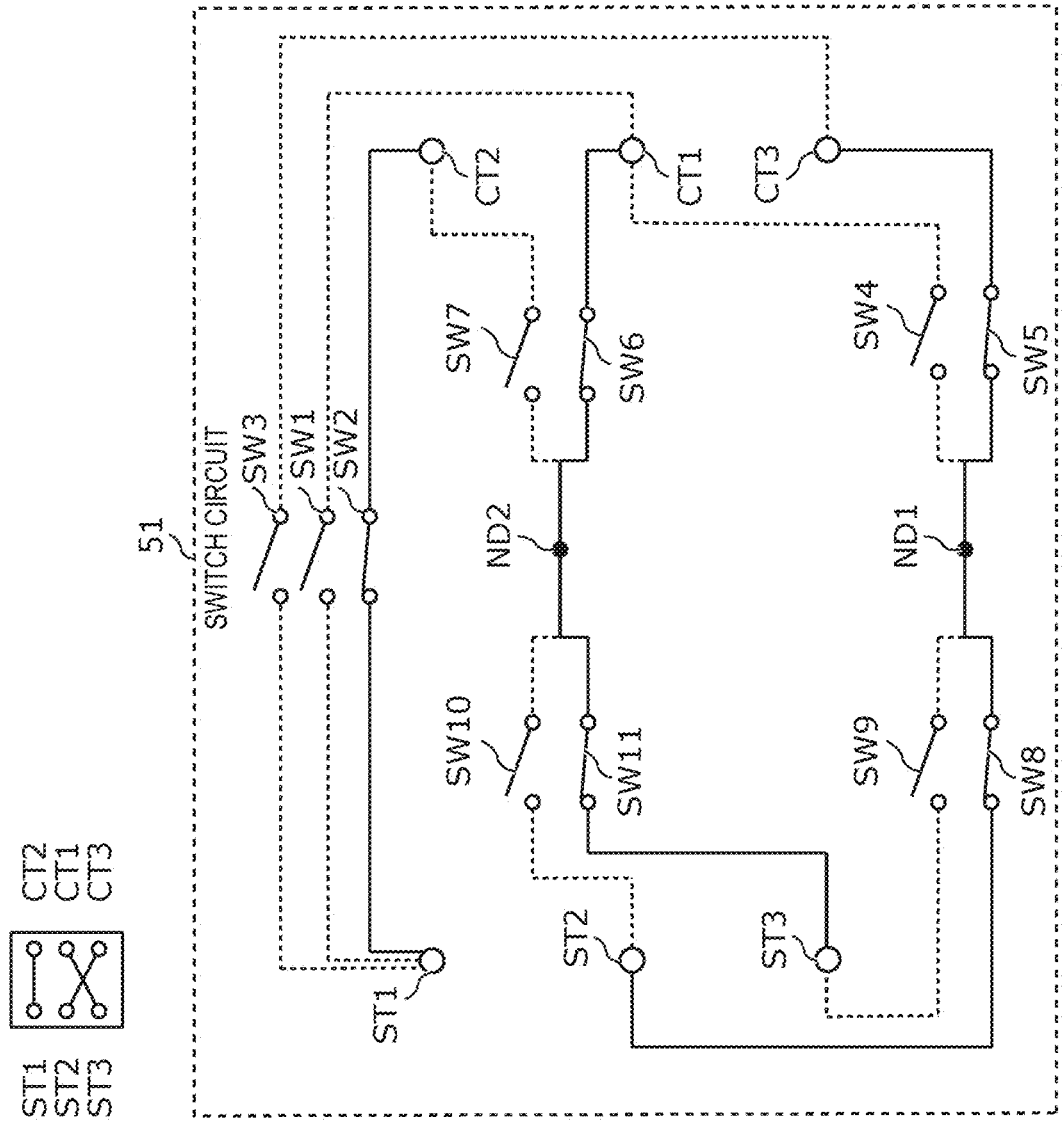
FIG. 8 is a diagram illustrating connection states inside the switch circuit according to Embodiment 1.

In FIG. 8, the switches SW2, SW5, SW6, SW8, and SW11 are closed and the other switches are open. Thus, the common terminal CT1 is connected to the selection terminal ST3 via the switch SW6, the node ND2, and the switch SW11. The common terminal CT2 is connected to the selection terminal ST1 via the switch SW2. The common terminal CT3 is connected to the selection terminal ST2 via the switch SW5, the node ND1, and the switch SW8.

Figure 9:
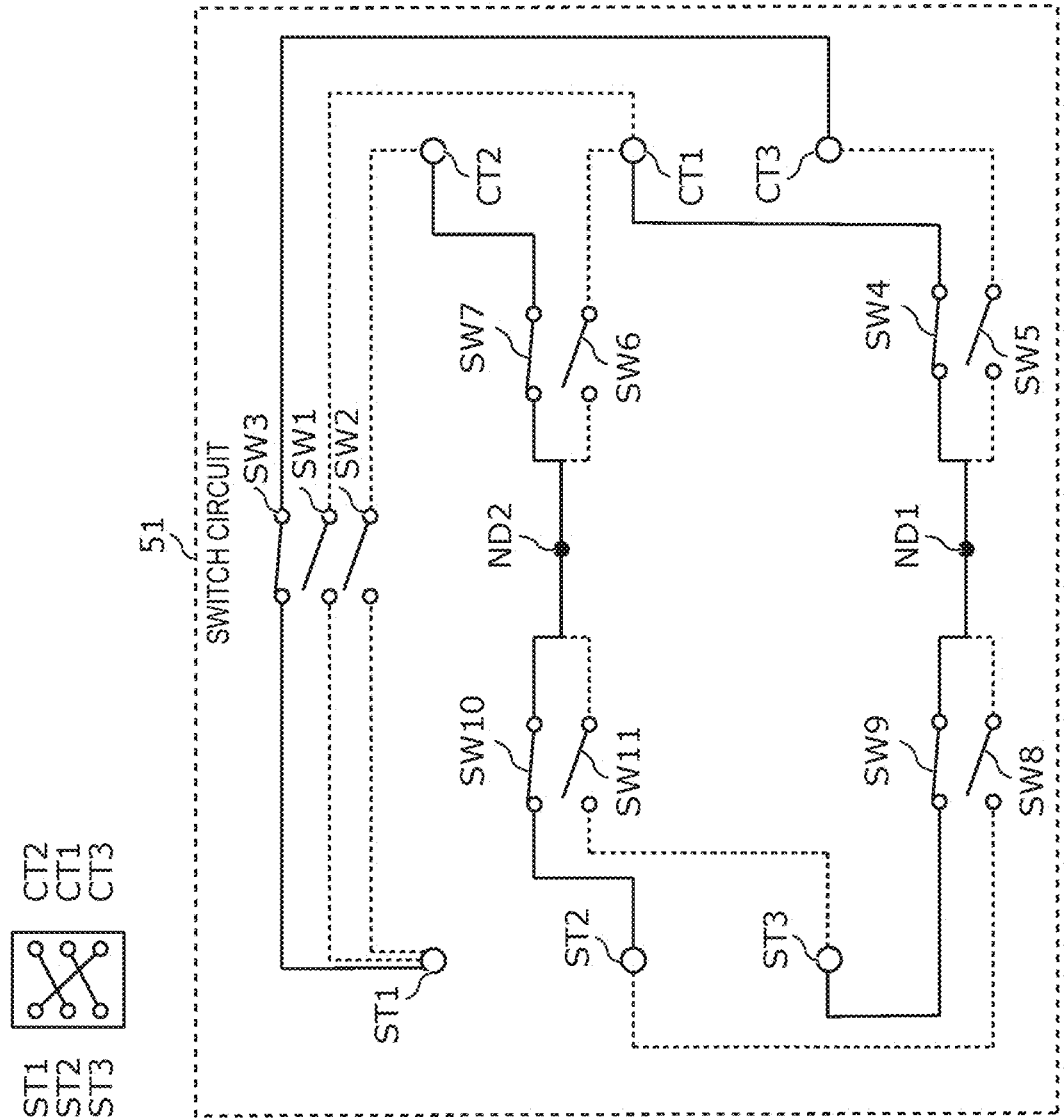
FIG. 9 is a diagram illustrating connection states inside the switch circuit according to Embodiment 1.

In FIG. 9, the switches SW3, SW4, SW7, SW9, and SW10 are closed and the other switches are open. Thus, the common terminal CT1 is connected to the selection terminal ST3 via the switch SW4, the node ND1, and the switch SW9. The common terminal CT2 is connected to the selection terminal ST2 via the switch SW7, the node ND2, and the switch SW10. The common terminal CT3 is connected to the selection terminal ST1 via the switch SW3.

As described above, in the switch circuit 51, crossings and overpass crossings between three paths can be eliminated for the connections between the three common terminals CT1 to CT3 and the three selection terminals ST1 to ST3, and as a result, isolation between the paths can be improved compared to the comparative example.

Although connection states in which the three common terminals CT1 to CT3 are connected to the three selection terminals ST1 to ST3 are illustrated in FIGS. 4 to 9, the connections between the common terminals CT1 to CT3 and the selection terminals ST1 to ST3 inside the switch circuit 51 are not limited to those illustrated in FIGS. 4 to 9. For example, only one or two of the three common terminals CT1 to CT3 may be connected to one or two of the selection terminals ST1 to ST3. In this case, the remaining two or one of the common terminals CT1 to CT3 does not have to be connected to a selection terminal.

1.5 Example Configuration of Radio-Frequency Circuit 1

Figure 10:
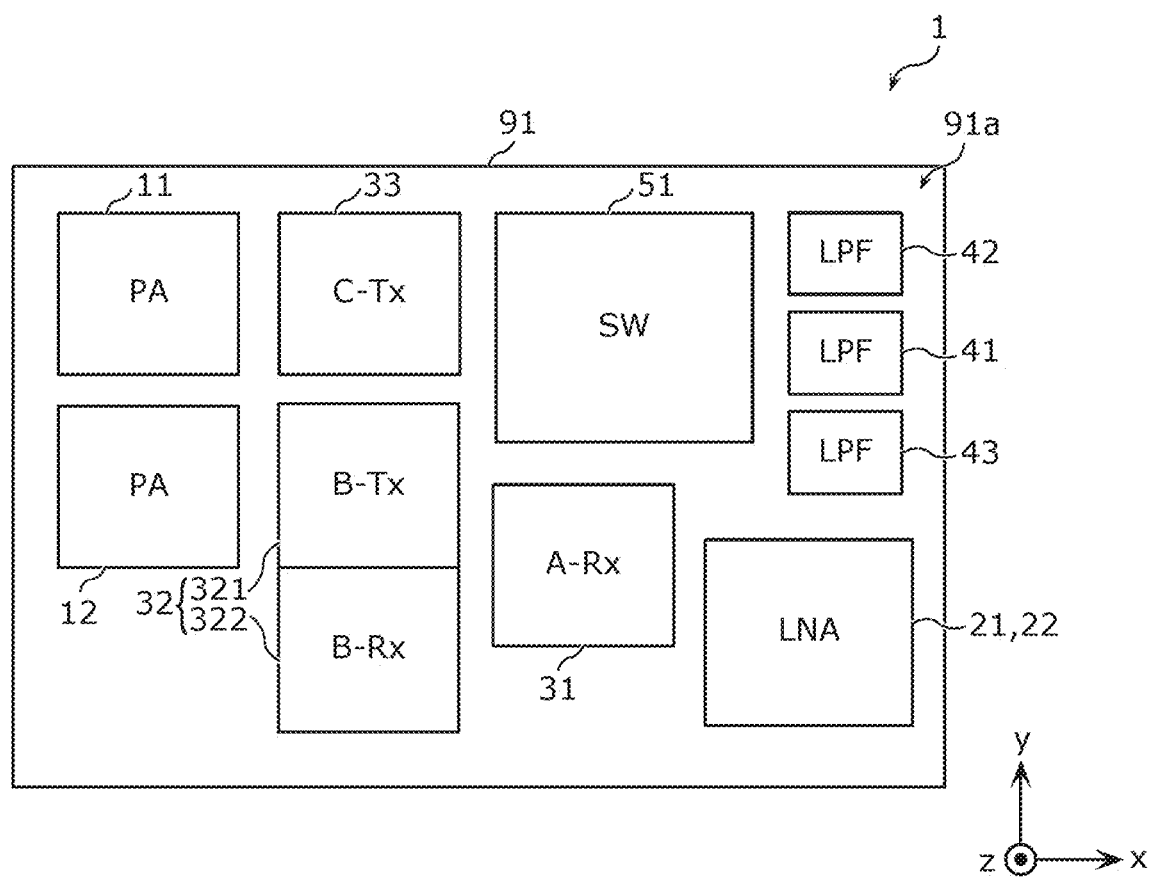
FIG. 10 is a plan view of a radio-frequency module in which a radio-frequency circuit according to Embodiment 1 is mounted.
Figure 11:
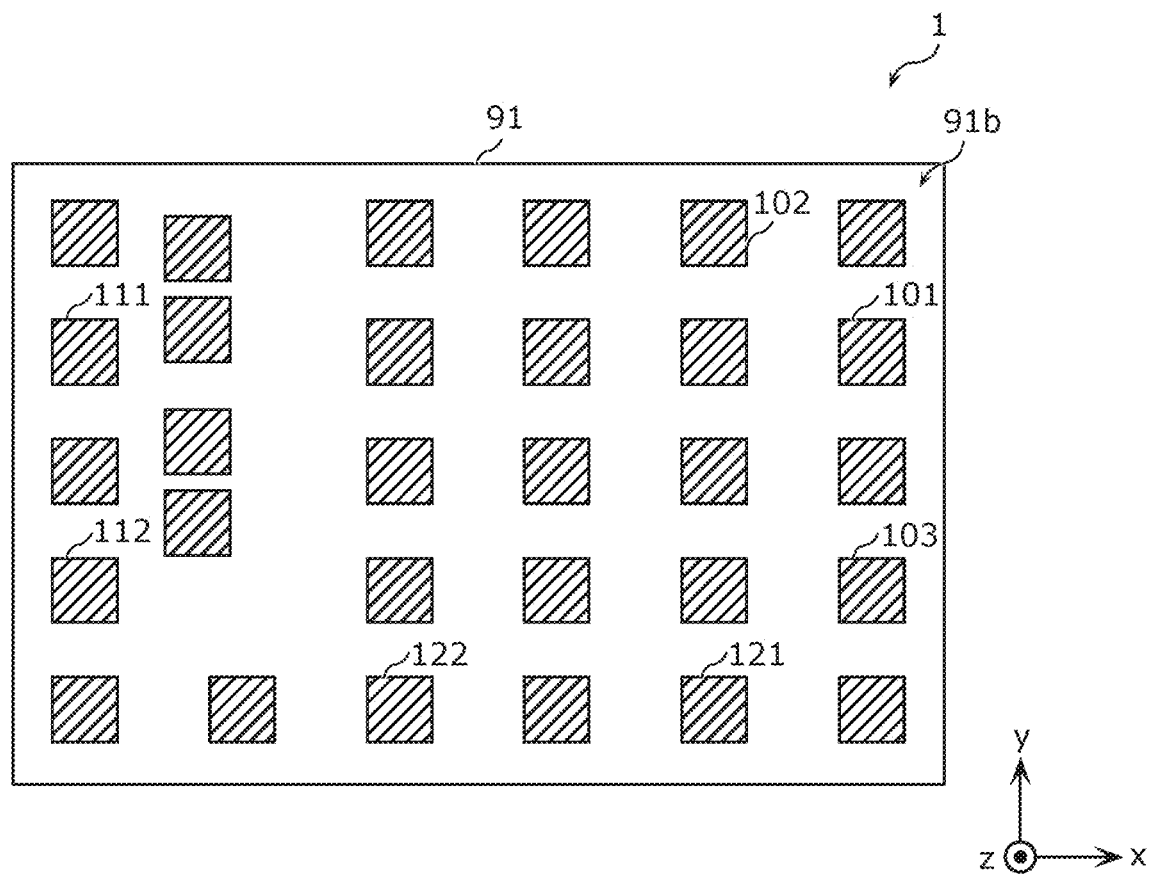
FIG. 11 is a plan view of the radio-frequency module in which the radio-frequency circuit according to Embodiment 1 is mounted.

Next, an example configuration of the radio-frequency circuit 1 will be described while referring to FIGS. 10 and 11. FIG. 10 is a plan view of a radio-frequency module in which the radio-frequency circuit 1 according to this embodiment is mounted. In the drawing, components on a main surface 91a of a module substrate 91 are illustrated in a see-through manner from the positive side of the z-axis. FIG. 11 is a plan view of the radio-frequency module in which the radio-frequency circuit 1 according to this embodiment is mounted. In the drawing, components on a main surface 91b of the module substrate 91 are illustrated in a see-through manner from the positive side of the z-axis. In FIGS. 10 and 11, some of the components are marked with letters representing the components so that the arrangement relationship of the individual components can be easily understood, but the actual components need not be marked with such letters. In FIGS. 10 and 11, illustration of wiring lines connected between the components is omitted.

FIGS. 10 and 11 illustrates an example configuration of the radio-frequency circuit 1. The radio-frequency circuit 1 can be realized using any of a wide variety of circuit configurations and circuit technologies. Therefore, the description of an example configuration of the radio-frequency circuit 1 provided below should not be interpreted as being limiting.

The radio-frequency circuit 1 is mounted on the radio-frequency module substrate 91. The module substrate 91 has the two main surfaces 91a and 91b, which face each other. As illustrated in FIG. 10, the power amplifiers 11 and 12 (PA), the low-noise amplifiers 21 and 22 (LNA), the filters 31 and 33 (A-Rx, C-Tx), the filter 32, which includes the transmission filter 321 (B-Tx) and the reception filter 322 (B-Rx), the low-pass filters 41 to 43 (LPF), and the switch circuit 51 (SW) are disposed on the main surface 91a of the module substrate 91. As illustrated in FIG. 11, multiple external connection terminals are disposed on the main surface 91b of the module substrate 91. The external connection terminals include the antenna connection terminals 101 to 103, the input terminals 111 and 112, and the output terminals 121 and 122.

The power amplifiers 11 and 12 are, for example, realized using heterojunction bipolar transistors (HBTs) and are mounted in semiconductor integrated circuits. For example, silicon germanium (SiGe) or gallium arsenide (GaAs) is used as the semiconductor material. The amplifying transistor of the power amplifier 11 does not have to be a HBT. For example, a high electron mobility transistor (HEMT) or a metal-semiconductor field effect transistor (MESFET) may be used for the power amplifier 11. In this case, gallium nitride (GaN) or silicon carbide (SiC) may be used as the semiconductor material.

The low-noise amplifiers 21 and 22 are, for example, realized using complementary metal oxide semiconductor (CMOS) and are mounted in a semiconductor integrated circuit. The semiconductor integrated circuits may be manufactured using a silicon on insulator (SOI) process. Silicon (Si) is used as the semiconductor material, for example. At least one out of gallium arsenide (GaAs), silicon germanium (SiGe), and gallium nitride (GaN) may be used as the semiconductor material.

The filters 31 to 33 are realized using, for example, surface acoustic wave (SAW) filters, bulk acoustic wave (BAW) filters, LC filters, or dielectric filters, or any combination of these types of filters and are mounted. The way in which the filters 31 to 33 are realized is not limited to that described above.

The low-pass filters 41 to 43 are realized using, for example, SAW filters, BAW filters, LC filters, or dielectric filters, or any combination of these types of filters and are mounted. The way in which the low-pass filters 41 to 43 are realized is not limited to that described above.

The switch circuit 51 is, for example, formed using FETs and/or bipolar transistors and is mounted in a semiconductor integrated circuit. Silicon (Si) is used as the semiconductor material, for example. At least one out of gallium arsenide (GaAs), silicon germanium (SiGe), and gallium nitride (GaN) may be used as the semiconductor material.

1.6 Example Configuration of Switch Circuit 51

Figure 12:
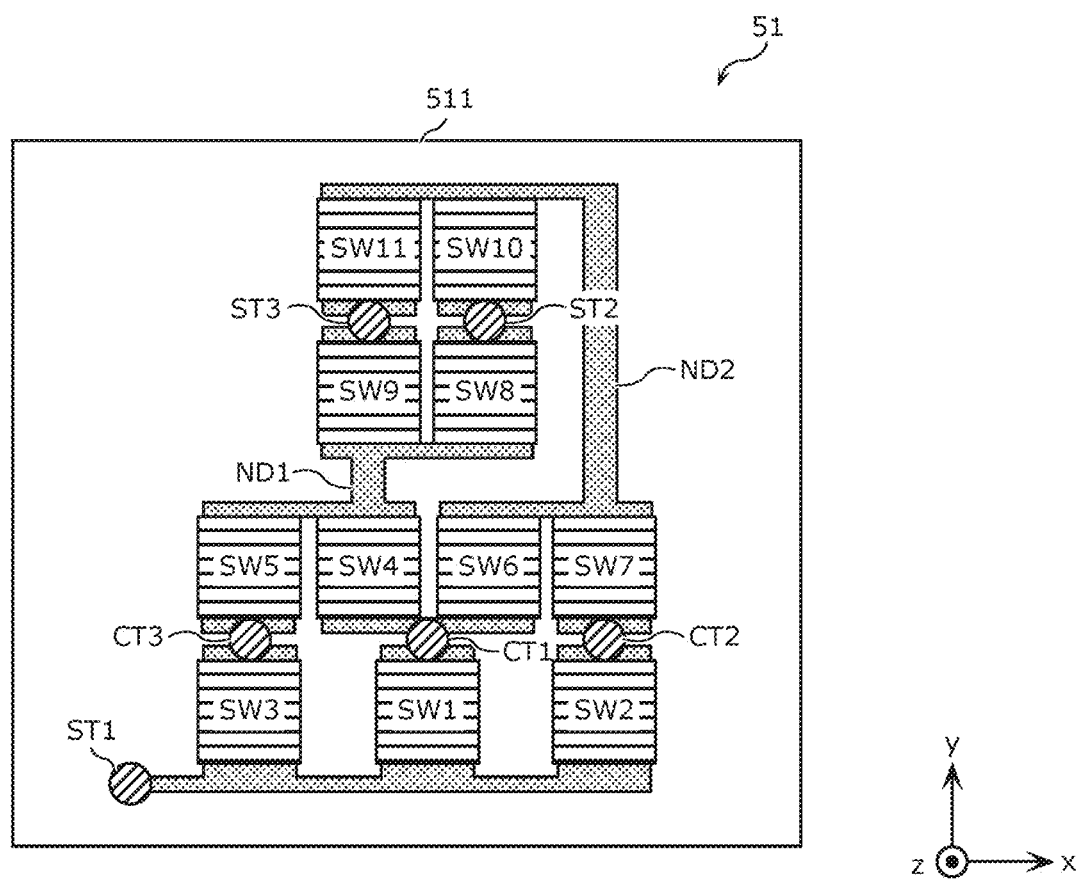
FIG. 12 is a plan view of a semiconductor integrated circuit in which the switch circuit according to Embodiment 1 is mounted.

The internal structure of a semiconductor integrated circuit 511 in which the switch circuit 51 is mounted will be described while referring to FIG. 12. FIG. 12 is a plan view of the semiconductor integrated circuit 511 in which the switch circuit 51 according to this embodiment is mounted. In the drawing, the elements in the semiconductor integrated circuit 511 are illustrated in a see-through manner from the positive side of the z axis.

FIG. 12 illustrates an example configuration of the switch circuit 51, and the switch circuit 51 can be realized using any of a wide variety of circuit configurations and circuit technologies. Therefore, the description of an example configuration of the switch circuit 51 provided below should not be interpreted as being limiting.

The semiconductor integrated circuit 511 includes the common terminals CT1 to CT3 and the selection terminals ST1 to ST3, and the switches SW1 to SW11 are mounted therein. The switches SW1 to SW11 are formed of multiple serially connected FETs.

Hereafter, the arrangements of the elements of the semiconductor integrated circuit 511 in the plan view will be described.

The common terminals CT1 to CT3 are disposed along the x-axis. The common terminal CT1 is disposed between the common terminals CT2 and CT3.

The switches SW1 to SW3 are disposed along the x-axis. The switch SW1 is disposed between the switches SW2 and SW3.

The switches SW4 to SW7 are disposed along the x-axis. The switches SW4 and SW6 are disposed between the switches SW5 and SW7. The switches SW4 and SW5 are adjacent to each other, and the switches SW6 and SW7 are adjacent to each other.

The switch SW1, the common terminal CT1, and the switch SW4 are disposed substantially along the y-axis. The common terminal CT1 is disposed between the switches SW1 and SW4 and adjacent to the switches SW1 and SW4.

The switch SW1, the common terminal CT1, and the switch SW6 are disposed substantially along the y-axis. The common terminal CT1 is disposed between the switches SW1 and SW6 and adjacent to the switches SW1 and SW6.

The switch SW2, the common terminal CT2, and the switch SW7 are disposed along the y-axis. The common terminal CT2 is disposed between the switches SW2 and SW7 and adjacent to the switches SW2 and SW7.

The switch SW3, the common terminal CT3, and the switch SW5 are disposed next to each other along the y-axis. The common terminal CT3 is disposed between the switches SW3 and SW5 and adjacent to the switches SW3 and SW5.

The selection terminals ST2 and ST3 are disposed along the x-axis, the switches SW8 and SW9 are also disposed along the x-axis, and the switches SW10 and SW11 are also disposed along the x-axis.

The switch SW8, the selection terminal ST2, and the switch SW10 are disposed next to each other along the y-axis. The selection terminal ST2 is disposed between the switches SW8 and SW10 and adjacent to the switches SW8 and SW10.

The switch SW9, the selection terminal ST3, and the switch SW11 are disposed next to each other along the y-axis. The selection terminal ST3 is disposed between the switches SW9 and SW11 and adjacent to the switches SW9 and SW11.

The selection terminal ST1 is disposed on the opposite side of the switches SW1 to SW3 from the common terminals CT1 to CT3. The selection terminal ST1 is disposed closer to the common terminals CT1 to CT3 than each of the selection terminals ST2 and ST3 are. In other words, the shortest distance between the selection terminal ST1 and the common terminals CT1 to CT3 (the shortest distance between the selection terminal ST1 and the common terminal CT3 in FIG. 12) is shorter than the shortest distance between the selection terminal ST2 and the common terminals CT1 to CT3 (the shortest distance between the selection terminal ST2 and the common terminal CT1 in FIG. 12), and is shorter than the shortest distance between the selection terminal ST3 and the common terminals CT1 to CT3 (the shortest distance between the selection terminal ST3 and the common terminal CT1 in FIG. 12).

1.7 Effects and so Forth

As described above, the switch circuit 51 according to this embodiment includes the common terminals CT1 to CT3, the selection terminal ST1 that is connectible to the common terminals CT1 to CT3, the selection terminals ST2 and ST3 that are connectible to the common terminals CT1 and CT3 via the node ND1 and are connectible to the common terminals CT1 and CT2 via the node ND2, the switch SW1 connected between the common terminal CT1 and the selection terminal ST1, the switch SW2 connected between the common terminal CT2 and the selection terminal ST1, the switch SW3 connected between the common terminal CT3 and the selection terminal ST1, the switch SW4 connected between the common terminal CT1 and the node ND1, the switch SW5 connected between the common terminal CT3 and the node ND1, the switch SW6 connected between the common terminal CT1 and the node ND2, the switch SW7 connected between the common terminal CT2 and the node ND2, the switch SW8 connected between the selection terminal ST2 and the node ND1, the switch SW9 connected between the selection terminal ST3 and the node ND1, the switch SW10 connected between the selection terminal ST2 and the node ND2, and the switch SW11 connected between the selection terminal ST3 and the node ND2.

With this configuration, the selection terminals ST2 and ST3 are connectible to the common terminals CT1 and CT3 via the node ND1 and are connectible to the common terminals CT1 and CT2 via the node ND2. As a result, crossings or overpass crossings between paths inside the switch circuit 51, with the exception of nodes ND1 and ND2, can be eliminated. In the switch circuit 51, a switch is connected between the node ND1 and each of the common terminals CT1 and CT3 and the selection terminals ST2 and ST3, and a switch is connected between the node ND2 and each of the common terminals CT1 and CT2 and the selection terminals ST2 and ST3. Therefore, based on the three common terminals CT1 to CT3 and the three selection terminals ST1 to ST3 being connected in a one-to-one manner, the number of paths between terminals connected to each node can be limited to one for any particular connection (refer to FIGS. 4 to 9). Thus, in the switch circuit 51, crossings or overpass crossings between multiple paths used simultaneously can be eliminated and isolation between the paths can be improved. The thus-configured switch circuit 51 can be suitably used for switching multiple antennas for transmitting sounding reference signals (SRS).

For example, in the switch circuit 51 according to this embodiment, the common terminals CT1 to CT3, the selection terminals ST1 to ST3, and the switches SW1 to SW11 may be included in the semiconductor integrated circuit 511, and the selection terminal ST1 may be disposed closer to the common terminals CT1 to CT3 than each of the selection terminals ST2 and ST3 is based on the semiconductor integrated circuit 511 being viewed in plan view.

In this configuration, the selection terminal ST1 is disposed near the common terminals CT1 to CT3. Therefore, the wiring length between the selection terminal ST1 and each of the common terminals CT1 to CT3 can be shortened, and loss due to wiring resistance and mismatching loss due to stray capacitances of the wiring can be reduced. In particular, since the selection terminal ST1 is connected to the common terminals CT1 to CT3 with fewer switches and without nodes therebetween, the insertion loss of paths extending through the selection terminal ST1 is smaller than that of paths through the other selection terminals ST2 and ST3. Therefore, the reduction of loss achieved by shortening the wiring line lengths between the selection terminal ST1 and the common terminals CT1 to CT3 is significant.

In addition, the radio-frequency circuit 1 according to this embodiment includes the switch circuit 51, the low-pass filter 41 connected to the common terminal CT1, the low-pass filter 42 connected to the common terminal CT2, and the low-pass filter 43 connected to the common terminal CT3.

Thus, a low-pass filter is connected to each of the common terminals CT1 to CT3. Therefore, regardless of which common terminal is connected to the transmission path, harmonic distortion can be reduced and the quality of the transmission signal can be improved.

In addition, for example, the radio-frequency circuit 1 according to this embodiment may further include the filter 31 connected to the selection terminal ST1, the filter 32 connected to the selection terminal ST2, and the filter 33 connected to the selection terminal ST3.

Thus, a filter is connected to each of the selection terminals ST1 to ST3. Thus, simultaneous communication can be achieved in at least three different frequency bands.

In addition, for example, in the radio-frequency circuit 1 according to this embodiment, the filter 31 may be a band-pass filter having a passband that includes a reception band of Band A.

Thus, the selection terminal ST1 can be used for a reception path of Band A. The selection terminal ST1 is connected to the common terminals CT1 to CT3 with fewer switches and without nodes therebetween, and therefore the insertion loss in the reception path of Band A can be improved and reception sensitivity can be improved.

In addition, for example, in the radio-frequency circuit 1 according to this embodiment, the filter 32 may be a duplexer that includes the transmission filter 321 having a passband that includes the transmission band of Band B, in which communication can be performed simultaneously with communication in Band A, and the reception filter 322 having a passband that includes the reception band of Band B.

This allows the selection terminal ST2 to be used for both the transmission path and the reception path of Band B.

For example, in the radio-frequency circuit 1 according to this embodiment, the filter 33 may be a band-pass filter having a passband that includes a transmission band of Band C, in which communication can be simultaneously performed with communication in Bands A and B.

Thus, the selection terminal ST3 can be used for a transmission path of Band C.

Modification 1 of Embodiment 1

Next, Modification 1 of Embodiment 1 will be described. This modification mainly differs from Embodiment 1 described above in that the number of selection terminals of the switch circuit is increased. Hereafter, this modification will be described focusing on points that are different from Embodiment 1.

2.1 Circuit Configuration of Switch Circuit 51A

Figure 13:
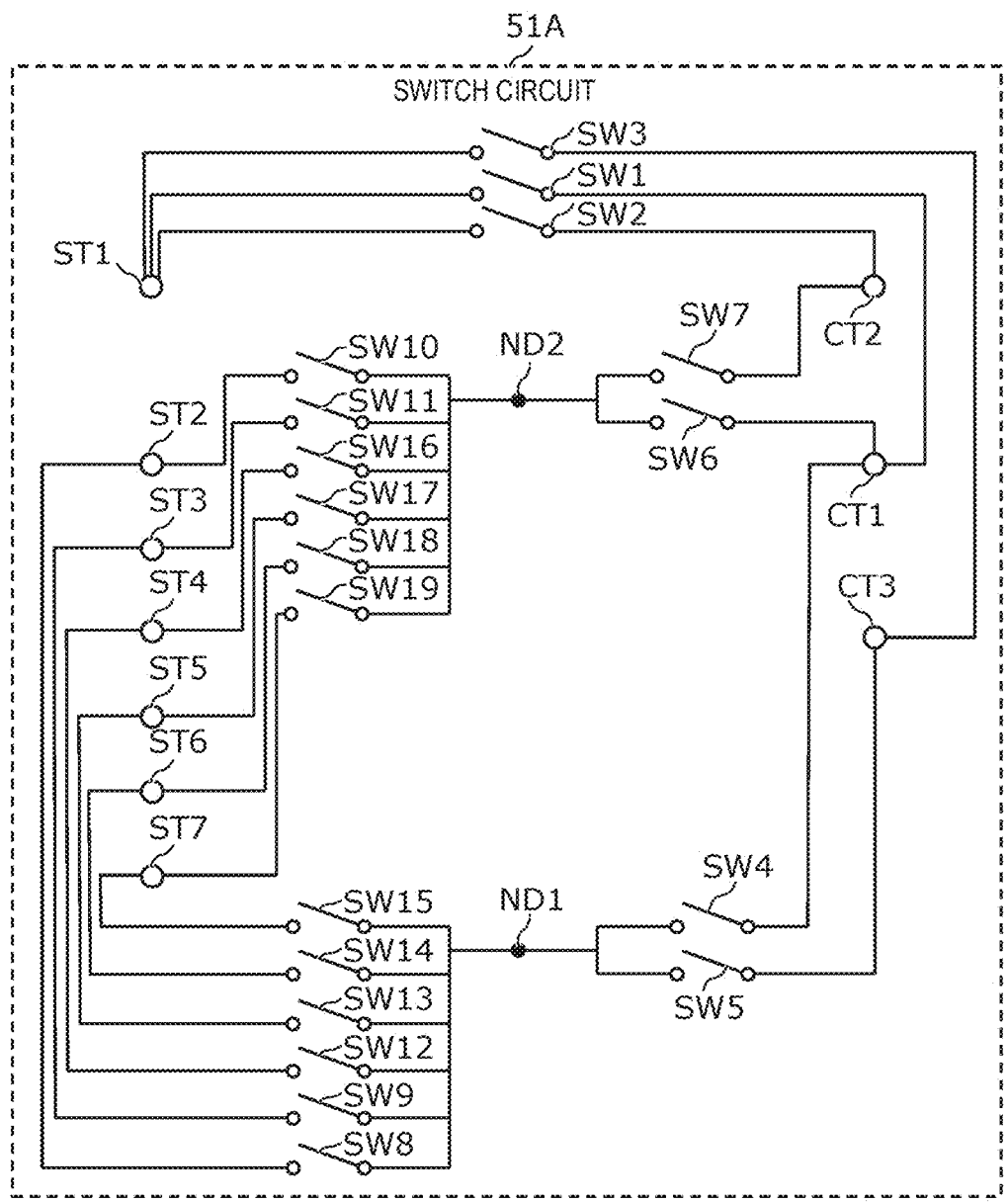
FIG. 13 is a circuit configuration diagram of a switch circuit according to Modification 1 of Embodiment 1.

The circuit configuration of a switch circuit 51A according to this modification will be described while referring to FIG. 13. FIG. 13 is a circuit configuration diagram of the switch circuit 51A according to this modification.

FIG. 13 illustrates an example circuit configuration. The switch circuit 51A can be realized using any of a wide variety of circuit configurations and circuit technologies. Therefore, the description of the switch circuit 51A provided below should not be interpreted as being limiting.

The switch circuit 51A is included in the radio-frequency circuit 1 instead of the switch circuit 51. The switch circuit 51A includes selection terminals ST4 to ST7 and switches SW12 to SW19 in addition to the common terminals CT1 to CT3, the selection terminals ST1 to ST3, and the switches SW1 to SW11.

The selection terminals ST4 to ST7 are examples of one or more fourth selection terminals and are connected to a transmission path and/or reception path. For example, each of the selection terminals ST4 to ST7 is connected to a band-pass filter or a duplexer.

The switches SW12 to SW15 are examples of one or more twelfth switches and are connected between the selection terminals ST4 to ST7 and the node ND1. Based on the switches SW8, SW9 and SW12 to SW15 being selectively closed, the selection terminals ST2 to ST7 are selectively connected to the node ND1.

The switches SW16 to SW19 are examples of one or more thirteenth switches and are connected between the selection terminals ST4 to ST7 and the node ND2. Based on the switches SW10, SW11 and SW16 to SW19 being selectively closed, selection terminals ST2 to ST7 are selectively connected to the node ND2.

Based on the switch circuit 51A as described above connecting the selection terminal ST1 to any one of the common terminals CT1 to CT3 or any two of the selection terminals ST2 to ST7 to the remaining two of the common terminals CT1 to CT3 in a one-to-one manner, crossings and overpass crossings can be eliminated between the three paths connecting the three selection terminals to the three common terminals and isolation between the paths can be improved.

2.2 Example Configuration of Switch Circuit 51A

Figure 14:
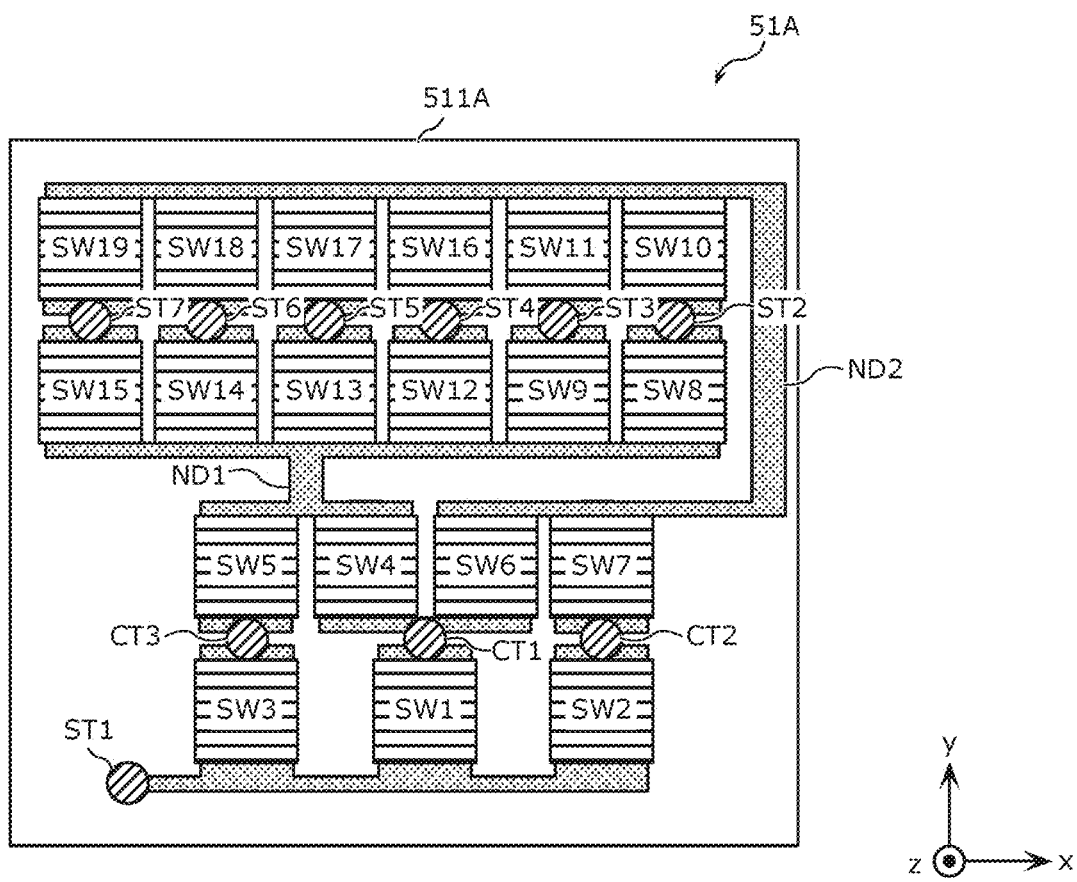
FIG. 14 is a plan view of a semiconductor integrated circuit in which the switch circuit according to Modification 1 of Embodiment 1 is mounted.

The internal structure of a semiconductor integrated circuit 511A in which the switch circuit 51A is mounted will be described while referring to FIG. 14. FIG. 14 is a plan view of the semiconductor integrated circuit 511A in which the switch circuit 51A according to this modification is mounted. In the drawings, the elements in the semiconductor integrated circuit 511A are illustrated in a see-through manner from the positive side of the z axis.

FIG. 14 illustrates an example configuration of the switch circuit 51A, and the switch circuit 51A can be realized using any of a wide variety of circuit configurations and circuit technologies. Therefore, the description of an example configuration of the switch circuit 51A provided below should not be interpreted as being limiting.

The semiconductor integrated circuit 511A includes common terminals CT1 to CT3 and selection terminals ST1 to ST7, and switches SW1 to SW19 are mounted therein. The switches SW1 to SW19 are formed of multiple serially connected FETs.

Hereafter, the arrangement of the elements of the semiconductor integrated circuit 511A in plan view will be described.

The common terminals CT1 to CT3 are disposed along the x-axis. The common terminal CT1 is disposed between the common terminals CT2 and CT3.

The switches SW1 to SW3 are disposed along the x-axis. The switch SW1 is disposed between the switches SW2 and SW3.

The switches SW4 to SW7 are disposed along the x-axis. The switches SW4 and SW6 are disposed between the switches SW5 and SW7. The switches SW4 and SW5 are adjacent to each other, and the switches SW6 and SW7 are adjacent to each other.

The switch SW1, the common terminal CT1, and the switch SW4 are disposed substantially along the y-axis. The common terminal CT1 is disposed between the switches SW1 and SW4 and adjacent to the switches SW1 and SW4.

The switch SW1, the common terminal CT1, and the switch SW6 are disposed substantially along the y-axis. The common terminal CT1 is disposed between the switches SW1 and SW6 and adjacent to the switches SW1 and SW6.

The switch SW2, the common terminal CT2, and the switch SW7 are disposed along the y-axis. The common terminal CT2 is disposed between the switches SW2 and SW7 and adjacent to the switches SW2 and SW7.

The switch SW3, the common terminal CT3, and the switch SW5 are disposed next to each other along the y-axis. The common terminal CT3 is disposed between the switches SW3 and SW5 and adjacent to the switches SW3 and SW5.

The selection terminals ST2 to ST7 are disposed along the x-axis, the switches SW8, SW9, and SW12 to SW15 are also disposed along the x-axis, and the switches SW10, SW11, and SW16 to SW19 are also disposed along the x-axis.

The switch SW8, the selection terminal ST2, and the switch SW10 are disposed next to each other along the y-axis. The selection terminal ST2 is disposed between the switches SW8 and SW10 and adjacent to the switches SW8 and SW10.

The switch SW9, the selection terminal ST3, and the switch SW11 are disposed next to each other along the y-axis. The selection terminal ST3 is disposed between the switches SW9 and SW11 and adjacent to the switches SW9 and SW11.

The switch SW12, the selection terminal ST4, and the switch SW16 are disposed next to each other along the y-axis. The selection terminal ST4 is disposed between the switches SW12 and SW16 and adjacent to the switches SW12 and SW16.

The switch SW13, the selection terminal ST5, and the switch SW17 are disposed next to each other along the y-axis. The selection terminal ST5 is disposed between the switches SW13 and SW17 and adjacent to the switches SW13 and SW17.

The switch SW14, the selection terminal ST6, and the switch SW18 are disposed next to each other along the y-axis. The selection terminal ST6 is disposed between the switches SW14 and SW18 and adjacent to the switches SW14 and SW18.

The switch SW15, the selection terminal ST7, and the switch SW19 are disposed next to each other along the y-axis. The selection terminal ST7 is disposed between the switches SW15 and SW19 and adjacent to the switches SW15 and SW19.

The selection terminal ST1 is disposed on the opposite side of the switches SW1 to SW3 from the common terminals CT1 to CT3. The selection terminal ST1 is disposed closer to the common terminals CT1 to CT3 than each of the selection terminals ST2 and ST7 is. In other words, the shortest distance between the selection terminal ST1 and the common terminals CT1 to CT3 (the shortest distance between the selection terminal ST1 and the common terminal CT3 in FIG. 14) is shorter than the shortest distance between the selection terminal ST2 and the common terminals CT1 to CT3 (the shortest distance between the selection terminal ST2 and the common terminal CT2 in FIG. 14), and is shorter than the shortest distance between the selection terminal ST3 and the common terminals CT1 to CT3 (the shortest distance between the selection terminal ST3 and the common terminal CT2 in FIG. 14). In addition, the shortest distance between the selection terminal ST1 and the common terminals CT1 to CT3 (the shortest distance between the selection terminal ST1 and the common terminal CT3 in FIG. 14) is shorter than the shortest distance between the selection terminal ST4 and the common terminals CT1 to CT3 (the shortest distance between the selection terminal ST4 and the common terminal CT1 in FIG. 14), and is shorter than the shortest distance between the selection terminal ST5 and the common terminals CT1 to CT3 (the shortest distance between the selection terminal ST5 and the common terminal CT3 in FIG. 14). In addition, the shortest distance between the selection terminal ST1 and the common terminals CT1 to CT3 (the shortest distance between the selection terminal ST1 and the common terminal CT3 in FIG. 14) is shorter than the shortest distance between the selection terminal ST6 and the common terminals CT1 to CT3 (the shortest distance between the selection terminal ST6 and the common terminal CT3 in FIG. 14), and is shorter than the shortest distance between the selection terminal ST7 and the common terminals CT1 to CT3 (the shortest distance between the selection terminal ST7 and the common terminal CT3 in FIG. 14).

2.3 Effects and so Forth

As described above, the switch circuit 51A according to this modification may further include the selection terminals ST4 to ST7, which are connectible to the common terminals CT1 and CT3 via the node ND1 and are connectible to the common terminals CT1 and CT2 via the node ND2, the switches SW12 to SW15, which are connected between the selection terminals ST4 to ST7 and the node ND1, and the switches SW16 to SW19, which are connected between the selection terminals ST4 to ST7 and the node ND2.

With this configuration, the selection terminals ST2 to ST7 are connectible to the common terminals CT1 and CT3 via the node ND1 and are connectible to the common terminals CT1 and CT2 via the node ND2. As a result, crossings or overpass crossings between paths inside the switch circuit 51A, with the exception of nodes ND1 and ND2, can be eliminated. In the switch circuit 51A, a switch is connected between the node ND1 and each of the common terminals CT1 and CT3 and the selection terminals ST2 to ST7, and a switch is connected between the node ND2 and each of the common terminals CT1 and CT2 and the selection terminals ST2 to ST7. Therefore, based on the selection terminal ST1 being connected to any one of the common terminals CT1 to CT3 or any two of the selection terminals ST2 to ST7 are connected in a one-to-one manner to the remaining two of the common terminals CT1 to CT3, the number of paths between terminals connected to each node can be limited to one for any particular connection. Thus, in the switch circuit 51A, crossings or overpass crossings between multiple paths used simultaneously can be eliminated and isolation between the paths can be improved. Such a switch circuit 51A can be suitably used for switching multiple antennas for transmitting SRS.

For example, in the switch circuit 51A according to this modification, the common terminals CT1 to CT3, the selection terminals ST1 to ST7, and the switches SW1 to SW19 may be included in the semiconductor integrated circuit 511A, and the selection terminal ST1 may be disposed closer to the common terminals CT1 to CT3 than each of the selection terminals ST2 and ST7 is based on the semiconductor integrated circuit 511A being viewed in plan view.

In this configuration, the selection terminal ST1 is disposed near the common terminals CT1 to CT3. Therefore, the wiring length between the selection terminal ST1 and each of the common terminals CT1 to CT3 can be shortened, and loss due to wiring resistance and mismatching loss due to stray capacitances of the wiring can be reduced. In particular, since the selection terminal ST1 is connected to the common terminals CT1 to CT3 with fewer switches and without nodes therebetween, the insertion loss of a path extending through the selection terminal ST1 is smaller than that of paths extending through the other selection terminals ST2 and ST7. Therefore, the reduction of loss achieved by shortening the wiring line lengths between the selection terminal ST1 and the common terminals CT1 to CT3 is significant.

In the switch circuit 51A according to this modification, the number of selection terminals is increased compared to the switch circuit 51, but the number of selection terminals is not limited to seven. For example, the number of selection terminals may be 4, 5, 6, 8, and 9, or even 10 or more. Among the selection terminals ST2 to ST7, the selection terminals for which the frequency bands of the radio-frequency signals to pass therethrough are close to each other or for which the frequency bands of the radio-frequency signals to pass therethrough partially overlap may be disposed adjacent to each other.

Modification 2 of Embodiment 1

Next, Modification 2 of Embodiment 1 will be described. This modification mainly differs from the first Embodiment described above in that a transmission path for a second generation (2G) cellular network is connected to the selection terminal ST1 of the switch circuit 51. Hereafter, this modification will be described focusing on points that are different from Embodiment 1.

3.1 Circuit Configuration of Radio-Frequency Circuit 1B

Figure 15:
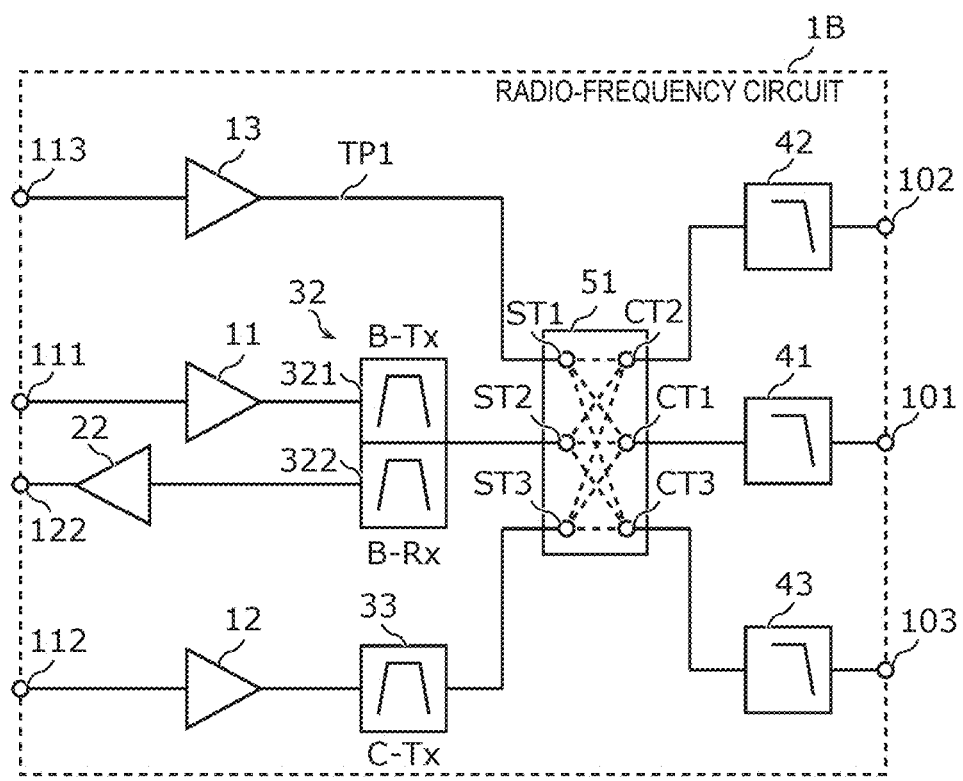
FIG. 15 is a circuit configuration diagram of a radio-frequency circuit according to Modification 2 of Embodiment 1.

The circuit configuration of a radio-frequency circuit 1B according to this modification will be described while referring to FIG. 15. FIG. 15 is a circuit configuration diagram of the radio-frequency circuit 1B according to this modification.

The radio-frequency circuit 1B is included in the communication device 5 instead of the radio-frequency circuit 1. The radio-frequency circuit 1B includes power amplifiers 11 to 13, the low-noise amplifier 22, the filter 32, which includes the transmission filter 321 and the reception filter 322, the filter 33, the low-pass filters 41 to 43, the switch circuit 51, the antenna connection terminals 101 to 103, the input terminals 111 to 113, and the output terminal 122.

The input terminal 113 is an external connection terminal of the radio-frequency circuit 1B and is for receiving 2G cellular network transmission signals from outside the radio-frequency circuit 1B. The input terminal 113 is connected to the RFIC 3 outside the radio-frequency circuit 1B and is connected to the input terminal of the power amplifier 13 inside the radio-frequency circuit 1B.

The power amplifier 13 is connected between the input terminal 113 and the switch circuit 51 and forms a transmission path TP1 for a 2G cellular network. Specifically, the input terminal of the power amplifier 13 is connected to the input terminal 113, and the output terminal of the power amplifier 13 is connected to the selection terminal ST1 of the switch circuit 51. In this connection configuration, the power amplifier 13 can amplify a 2G cellular network transmission signal supplied from the RFIC 3 via the input terminal 113.

3.2 Effects and so Forth

As described above, the radio-frequency circuit 1B according to this modification may include the transmission path TP1 for a 2G cellular network, and the transmission path TP1 may be connected to the selection terminal ST1.

With this configuration, the transmission path TP1 for a 2G cellular network, which requires a relatively high output power, is connected to the selection terminal ST1, which is connected to the common terminals CT1 to CT3 with fewer switches and without nodes therebetween. Therefore, the number of switches requiring higher power tolerance can be reduced.

Embodiment 2

Next, Embodiment 2 will be described. This embodiment differs mainly from Embodiment 1 described above in that low-pass filters are connected between the common terminals and the selection terminals of the switch circuit. Hereafter, this embodiment will be described while referring to the drawings focusing on the points that differ from Embodiment 1.

Figure 16:
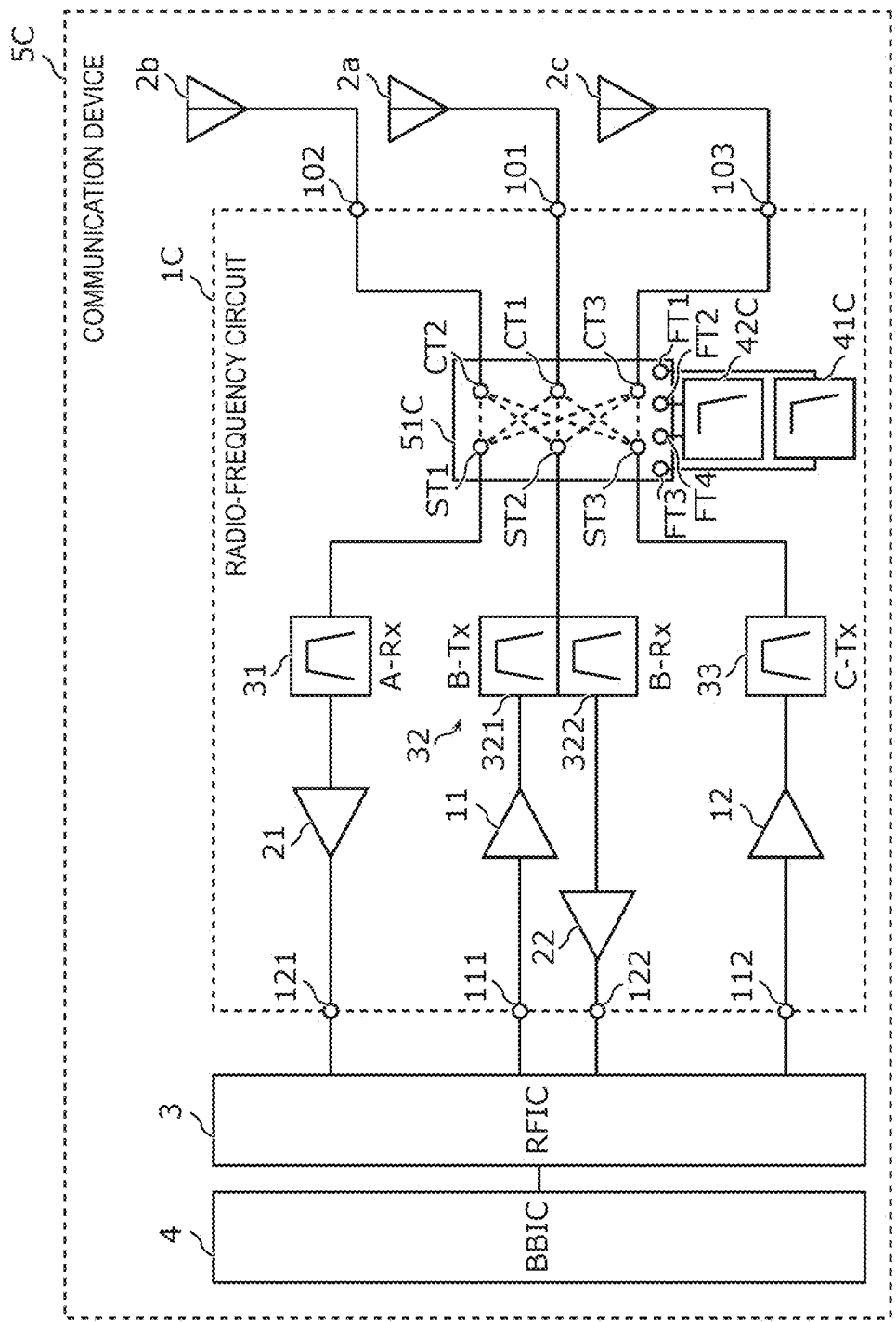
FIG. 16 is a circuit configuration diagram of a communication device according to Embodiment 2.
Figure 17:
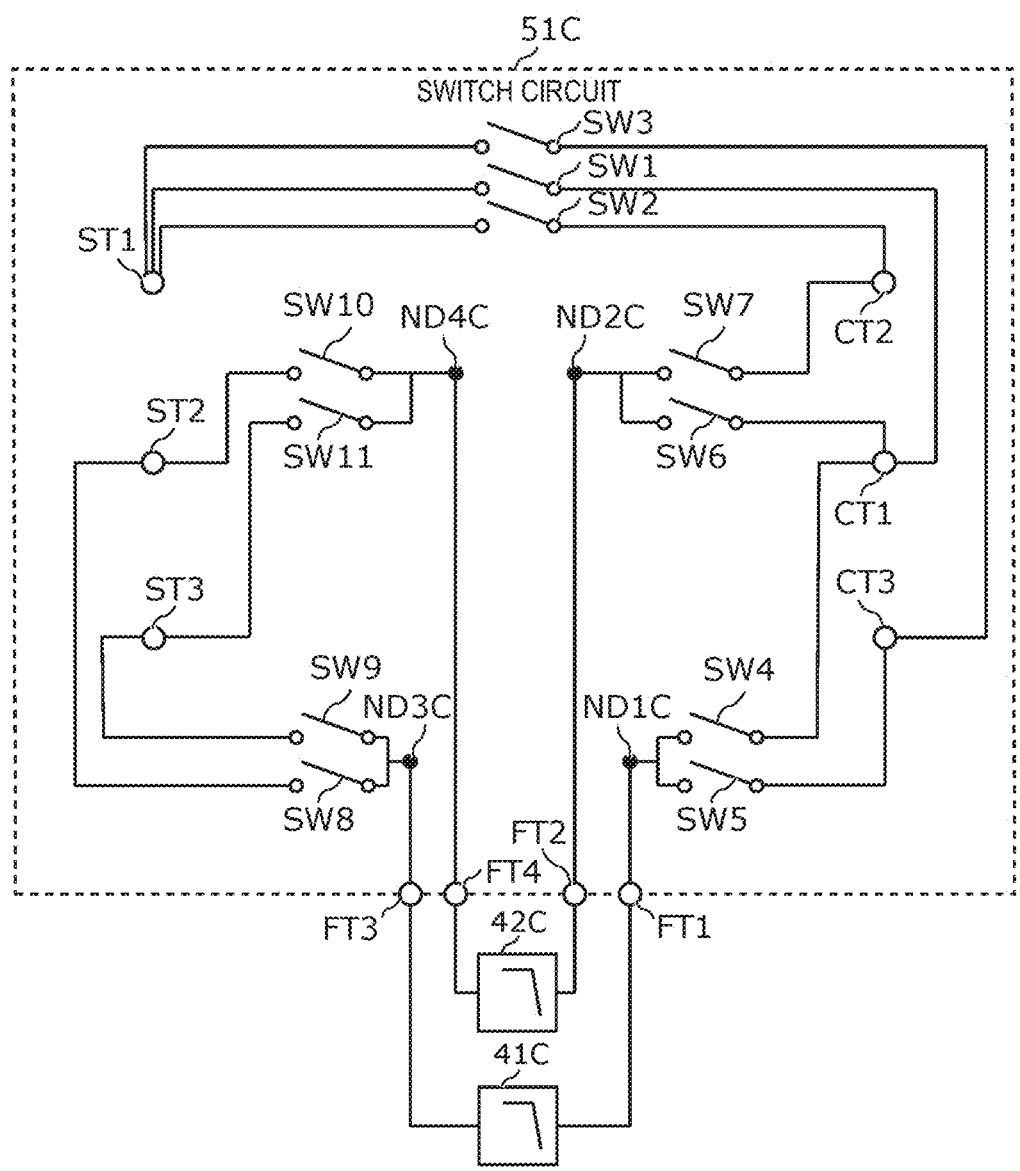
FIG. 17 is a circuit configuration diagram of a switch circuit according to Embodiment 2.

The circuit configurations of a communication device 5C, a radio-frequency circuit 1C, and a switch circuit 51C according to this embodiment will be described while referring to FIGS. 16 and 17. FIG. 16 is a circuit configuration diagram of the communication device 5C according to this embodiment. FIG. 17 is a circuit configuration diagram of the switch circuit 51C according to this embodiment.

FIGS. 16 and 17 illustrate example circuit configurations, and the communication device 5C, the radio-frequency circuit 1C, and the switch circuit 51C can be realized using any of a wide variety of circuit configurations and circuit technologies. Therefore, the description of the communication device 5C, the radio-frequency circuit 1C, and the switch circuit 51C provided hereafter should not be interpreted as being limiting.

Since the communication device 5C is substantially the same as the communication device 5 except for including the radio-frequency circuit 1C instead of the radio-frequency circuit 1, description of the communication device 5C is omitted.

4.1 Circuit Configuration of Radio-Frequency Circuit 1C

Next, the radio-frequency circuit 1C according to this embodiment will be described while referring to FIG. 16. The radio-frequency circuit 1C includes power amplifiers 11 and 12, low-noise amplifiers 21 and 22, filters 31 to 33, low-pass filters 41C and 42C, the switch circuit 51C, antenna connection terminals 101 to 103, input terminals 111 and 112, and output terminals 121 and 122.

The low-pass filter 41C is an example of a first low-pass filter and is connected to switch circuit 51C. The low-pass filter 41C has a higher cutoff frequency than Bands A to C.

The low-pass filter 42C is an example of a second low-pass filter and is connected to the switch circuit 51C. The low-pass filter 42C has a higher cutoff frequency than Bands A to C.

4.2 Circuit Configuration of Switch Circuit 51C

Next, the circuit configuration of the switch circuit 51C according to this embodiment will be described while referring to FIG. 17. The switch circuit 51C includes filter connection terminals FT1 to FT4 in addition to common terminals CT1 to CT3, selection terminals ST1 to ST3, and switches SW1 to SW11.

The filter connection terminal FT1 is an example of a first connection terminal and is connected to one end of the low-pass filter 41C outside the switch circuit 51C. The filter connection terminal FT1 is connected to a node ND1C inside the switch circuit 51C.

The filter connection terminal FT2 is an example of a second connection terminal and is connected to one end of the low-pass filter 42C outside the switch circuit 51C. The filter connection terminal FT2 is connected to a node ND2C inside the switch circuit 51C.

The filter connection terminal FT3 is an example of a third connection terminal and is connected to the other end of the low-pass filter 41C outside the switch circuit 51C. The filter connection terminal FT3 is connected to a node ND3C inside the switch circuit 51C.

The filter connection terminal FT4 is an example of a fourth connection terminal and is connected to the other end of the low-pass filter 42C outside the switch circuit 51C. The filter connection terminal FT4 is connected to a node ND4C inside the switch circuit 51C.

The node ND1C is an example of a first node and connects the switches SW4 and SW5 to the filter connection terminal FT1. The common terminals CT1 and CT3 are connected to the filter connection terminal FT1 via the node ND1C.

The node ND2C is an example of a second node and connects the switches SW6 and SW7 to the filter connection terminal FT2. The common terminals CT1 and CT2 are connected to the filter connection terminal FT2 via the node ND2C.

The node ND3C is an example of a third node and connects the switches SW8 and SW9 to the filter connection terminal FT3. The selection terminals ST2 and ST3 are connected to the filter connection terminal FT3 via the node ND3C.

The node ND4C is an example of a fourth node and connects the switches SW10 and SW11 to the filter connection terminal FT4. The selection terminals ST2 and ST3 are connected to the filter connection terminal FT4 via the node ND4C.

The low-pass filters 41C and 42C may be included in the switch circuit 51C. In this case, the switch circuit 51C does not need to include the filter connection terminals FT1 to FT4.

The connections between the common terminals CT1 to CT3 and the selection terminals ST1 to ST3 in the switch circuit 51C and the configuration of the switch circuit 51C are the substantially the same as in Embodiment 1 and therefore illustration and description thereof are omitted.

4.3 Effects and so Forth

As described above, the radio-frequency circuit 1C according to this embodiment includes the switch circuit 51C and the low-pass filters 41C and 42C. The switch circuit 51C includes the common terminals CT1 to CT3, the selection terminals ST1 to ST3, the filter connection terminal FT1 connected to the common terminals CT1 and CT3 via the node ND1C, the filter connection terminal FT2 connected to the common terminals CT1 and CT2 via the node ND2C, the filter connection terminal FT3 connected to the selection terminals ST2 and ST3 via the node ND3C, the filter connection terminal FT4 connected to the selection terminals ST2 and ST3 via the node ND4C, the switch SW1 connected between the common terminal CT1 and the selection terminal ST1, the switch SW2 connected between the common terminal CT2 and the selection terminal ST1, the switch SW3 connected between the common terminal CT3 and the selection terminal ST1, the switch SW4 connected between the common terminal CT1 and the node ND1C, the switch SW5 connected between the common terminal CT3 and the node ND1C, the switch SW6 connected between the common terminal CT1 and the node ND2C, the switch SW7 connected between the common terminal CT2 and the node ND2C, the switch SW8 connected between the selection terminal ST2 and the node ND3C, the switch SW9 connected between the selection terminal ST3 and the node ND3C, the switch SW10 connected between the selection terminal ST2 and the node ND4C, and the switch SW11 connected between the selection terminal ST3 and the node ND4C. The low-pass filter 41C is connected between the filter connection terminals FT1 and FT3. The low-pass filter 42C is connected between the filter connection terminals FT2 and FT4.

According to this configuration, the low-pass filter 41C is connected between the nodes ND1C and ND3C, and the low-pass filter 42C is connected between the nodes ND2C and ND4C. As a result, the number of low-pass filters can be reduced compared to a case where a low-pass filter is connected to each of the common terminals CT1 to CT3. Since a low-pass filter is used to attenuate harmonic distortion of a transmission signal, a low-pass filter does not need to be connected to a reception path connected to the selection terminal ST1.

In addition, for example, the radio-frequency circuit 1C according to this embodiment may further include the filter 31 connected to the selection terminal ST1, the filter 32 connected to the selection terminal ST2, and the filter 33 connected to the selection terminal ST3.

Thus, a filter is connected to each of the selection terminals ST1 to ST3. Thus, simultaneous communication can be achieved in at least three different frequency bands.

In addition, for example, in the radio-frequency circuit 1C according to this embodiment, the filter 31 may be a band-pass filter having a passband that includes a reception band of Band A.

Thus, the selection terminal ST1 can be used for a reception path of Band A. The selection terminal ST1 is connected to the common terminals CT1 to CT3 with fewer switches and without nodes therebetween, and therefore the insertion loss in the reception path of Band A can be improved and reception sensitivity can be improved.

In addition, for example, in the radio-frequency circuit 1C according to this embodiment, the filter 32 may be a duplexer that includes the transmission filter 321 having a passband that includes the transmission band of Band B, in which communication can be performed simultaneously with communication in Band A, and the reception filter 322 having a passband that includes the reception band of Band B.

This allows the selection terminal ST2 to be used for both the transmission path and the reception path of Band B.

For example, in the radio-frequency circuit 1C according to this embodiment, the filter 33 may be a band-pass filter having a passband that includes a transmission band of Band C, in which communication can be simultaneously performed with communication in Bands A and B.

Thus, the selection terminal ST3 can be used for a transmission path of Band C.

Other Embodiments

Embodiments and modifications of the embodiments of switch circuits and radio-frequency circuits according to the present disclosure have been described above, but switch circuits and radio-frequency circuits according to the present disclosure are not limited to the above-described embodiments and modifications. Other embodiments realized by combining any of the constituent elements of the above-described embodiments and modifications with one another, modifications obtained by modifying the above-described embodiments and modifications in various ways, as thought of by one skilled in the art, while not departing from the gist of the present disclosure, and various devices having the switch circuits and radio-frequency circuits built thereinto are included in the scope of the present disclosure.

For example, in the circuit configurations of the switch circuits and radio-frequency circuits according to the embodiments described above, other circuit elements, wiring lines, and so forth may be inserted midway along paths that connect the circuit elements and signal paths disclosed in the drawings. For example, in radio-frequency circuits, an impedance matching network may be inserted between a power amplifier and/or a low-noise amplifier and a filter.

In addition, for example, Modification 1 of Embodiment 1 may be combined with Embodiment 2. For example, the switch circuit 51C may be provided with additional selection terminals ST4 to ST7 similarly to the switch circuit 51A.

In each of the above-described embodiments and modifications, the switch circuit was mounted in a single semiconductor integrated circuit, but the switch circuit may instead be mounted in a separated manner in multiple semiconductor integrated circuits. For example, in the switch circuit 51 according to Embodiment 1, the common terminals CT1 to CT3, the selection terminal ST1, and the switches SW1 to SW7 may be included in one semiconductor integrated circuit, and the selection terminals ST2 and ST3, and the switches SW8 to SW11 may be included in another semiconductor integrated circuit.

The present disclosure can be widely used in communication devices such as mobile phones as switch circuits and radio-frequency circuits disposed in front end units.

What is claimed is:

1. A switch circuit comprising:
   a first common terminal, a second common terminal, and a third common terminal;
   a first selection terminal that is connectible to the first common terminal, the second common terminal, and the third common terminal;
   a second selection terminal and a third selection terminal that are connectible to the first common terminal and the third common terminal via a first node and is connectible to the first common terminal and the second common terminal via a second node;
   a first switch connected between the first common terminal and the first selection terminal;
   a second switch connected between the second common terminal and the first selection terminal;
   a third switch connected between the third common terminal and the first selection terminal;
   a fourth switch connected between the first common terminal and the first node;
   a fifth switch connected between the third common terminal and the first node;
   a sixth switch connected between the first common terminal and the second node;
   a seventh switch connected between the second common terminal and the second node;
   an eighth switch connected between the second selection terminal and the first node;
   a ninth switch connected between the third selection terminal and the first node;
   a tenth switch connected between the second selection terminal and the second node; and
   an eleventh switch connected between the third selection terminal and the second node.

2. The switch circuit according to claim 1,
   wherein the first common terminal, the second common terminal, the third common terminal, the first selection terminal, the second selection terminal, the third selection terminal, the first switch, the second switch, the third switch, the fourth switch, the fifth switch, the sixth switch, the seventh switch, the eighth switch, the ninth switch, the tenth switch, and the eleventh switch are included in a semiconductor integrated circuit, and
   the first selection terminal is disposed closer to the first common terminal, the second common terminal, and the third common terminal than each of the second selection terminal and the third selection terminal is based on the semiconductor integrated circuit being viewed in plan view.

3. The switch circuit according to claim 1, further comprising:
one or more fourth selection terminals that are connectible to the first common terminal and the third common terminal via the first node and are connectible to the first common terminal and the second common terminal via the second node;
one or more twelfth switches connected between respective ones of the one or more fourth selection terminals and the first node; and
one or more thirteenth switches connected between respective ones of the one or more fourth selection terminals and the second node.

4. The switch circuit according to claim 3,
wherein the first common terminal, the second common terminal, the third common terminal, the first selection terminal, the second selection terminal, the third selection terminal, the one or more fourth selection terminals, the first switch, the second switch, the third switch, the fourth switch, the fifth switch, the sixth switch, the seventh switch, the eighth switch, the ninth switch, the tenth switch, the eleventh switch, the one or more twelfth switches, and the one or more thirteenth switches are included in a semiconductor integrated circuit, and
the first selection terminal is disposed closer to the first common terminal, the second common terminal, and the third common terminal than each of the second selection terminal, the third selection terminal and one or more fourth selection terminals is based on the semiconductor integrated circuit being viewed in plan view.

5. A radio-frequency circuit comprising:
the switch circuit according to claim 1;
a first low-pass filter connected to the first common terminal;
a second low-pass filter connected to the second common terminal; and
a third low-pass filter connected to the third common terminal.

6. The radio-frequency circuit according to claim 5, further comprising:
a fourth filter connected to the first selection terminal;
a fifth filter connected to the second selection terminal; and
a sixth filter connected to the third selection terminal.

7. The radio-frequency circuit according to claim 6,
wherein the fourth filter is a band-pass filter having a passband that includes a reception band of a first band.

8. The radio-frequency circuit according to claim 7,
wherein the fifth filter is a duplexer that includes a transmission filter having a passband that includes a transmission band of a second band different from the first band, in which communication can be performed simultaneously with communication in the first band, and a reception filter having a passband that includes a reception band of the second band.

9. The radio-frequency circuit according to claim 8,
wherein the sixth filter is a band-pass filter having a passband that includes a transmission band of a third band different from the first and second bands, in which communication can be performed simultaneously with communication in the first band and the second band.

10. The radio-frequency circuit according to claim 5, further comprising:
a transmission path for a second generation cellular network,
wherein the transmission path is connected to the first selection terminal.

11. A radio-frequency circuit comprising:
a switch circuit; and
a first low-pass filter and a second low-pass filter,
wherein the switch circuit includes a first common terminal, a second common terminal, and a third common terminal,
a first selection terminal, a second selection terminal, and a third selection terminal,
a first connection terminal connected to the first common terminal and the third common terminal via a first node,
a second connection terminal connected to the first common terminal and the second common terminal via a second node,
a third connection terminal connected to the second selection terminal and the third selection terminal via a third node,
a fourth connection terminal connected to the second selection terminal and the third selection terminal via a fourth node,
a first switch connected between the first common terminal and the first selection terminal;
a second switch connected between the second common terminal and the first selection terminal;
a third switch connected between the third common terminal and the first selection terminal;
a fourth switch connected between the first common terminal and the first node;
a fifth switch connected between the third common terminal and the first node;
a sixth switch connected between the first common terminal and the second node;
a seventh switch connected between the second common terminal and the second node;
an eighth switch connected between the second selection terminal and the third node;
a ninth switch connected between the third selection terminal and the third node;
a tenth switch connected between the second selection terminal and the fourth node; and
an eleventh switch connected between the third selection terminal and the fourth node,
wherein the first low-pass filter is connected between the first connection terminal and the third connection terminal, and
the second low-pass filter is connected between the second connection terminal and the fourth connection terminal.

12. The radio-frequency circuit according to claim 11, further comprising:
a fourth filter connected to the first selection terminal;
a fifth filter connected to the second selection terminal; and
a sixth filter connected to the third selection terminal.

13. The radio-frequency circuit according to claim 12,
wherein the fourth filter is a band-pass filter having a passband that includes a reception band of a first band.

14. The radio-frequency circuit according to claim 13,
wherein the fifth filter is a duplexer that includes a transmission filter having a passband that includes a transmission band of a second band different from the first band, in which communication can be performed simultaneously with communication in the first band, and a reception filter having a passband that includes a reception band of the second band.

15. The radio-frequency circuit according to claim 14, wherein the sixth filter is a band-pass filter having a passband that includes a transmission band of a third band different from the first and second bands, in which communication can be performed simultaneously with communication in the first band and the second band.

16. The radio-frequency circuit according to claim 5, wherein the first common terminal, the second common terminal, the third common terminal, the first selection terminal, the second selection terminal, the third selection terminal, the first switch, the second switch, the third switch, the fourth switch, the fifth switch, the sixth switch, the seventh switch, the eighth switch, the ninth switch, the tenth switch, and the eleventh switch are included in a semiconductor integrated circuit, and the first selection terminal is disposed closer to the first common terminal, the second common terminal, and the third common terminal than each of the second selection terminal and the third selection terminal is based on the semiconductor integrated circuit being viewed in plan view.

17. The radio-frequency circuit according to claim 5, further comprising:

one or more fourth selection terminals that are connectible to the first common terminal and the third common terminal via the first node and are connectible to the first common terminal and the second common terminal via the second node;

one or more twelfth switches connected between respective ones of the one or more fourth selection terminals and the first node; and one or more thirteenth switches connected between respective ones of the one or more fourth selection terminals and the second node.

18. The radio-frequency circuit according to claim 17, wherein the first common terminal, the second common terminal, the third common terminal, the first selection terminal, the second selection terminal, the third selection terminal, the one or more fourth selection terminals, the first switch, the second switch, the third switch, the fourth switch, the fifth switch, the sixth switch, the seventh switch, the eighth switch, the ninth switch, the tenth switch, the eleventh switch, the one or more twelfth switches, and the one or more thirteenth switches are included in a semiconductor integrated circuit, and the first selection terminal is disposed closer to the first common terminal, the second common terminal, and the third common terminal than each of the second selection terminal, the third selection terminal and one or more fourth selection terminals is based on the semiconductor integrated circuit being viewed in plan view.

19. The radio-frequency circuit according to claim 5, wherein each of the first through third filters is one of a surface acoustic wave (SAW) filter, a bulk acoustic wave (BAW) filter, an LC filter, or a dielectric filter.

20. The radio-frequency circuit according to claim 6, wherein each of the fourth through sixth filters is one of a surface acoustic wave (SAW) filter, a bulk acoustic wave (BAW) filter, an LC filter, or a dielectric filter.

* * * * *